US011676883B2

(12) United States Patent
Shaikh et al.

(10) Patent No.: US 11,676,883 B2
(45) Date of Patent: Jun. 13, 2023

(54) THERMOELECTRIC COOLERS COMBINED WITH PHASE-CHANGE MATERIAL IN INTEGRATED CIRCUIT PACKAGES

(71) Applicant: Intel Corporation, Santa Clara, CA (US)

(72) Inventors: Javed Shaikh, Bangalore (IN); Je-Young Chang, Tempe, AZ (US); Kelly Lofgreen, Phoenix, AZ (US); Weihua Tang, Chandler, AZ (US); Aastha Uppal, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 940 days.

(21) Appl. No.: 16/355,596

(22) Filed: Mar. 15, 2019

(65) Prior Publication Data

US 2020/0294884 A1    Sep. 17, 2020

(51) Int. Cl.
| | | |
|---|---|---|
| *H01L 23/38* | (2006.01) | |
| *H01L 35/10* | (2006.01) | |
| *H01L 35/30* | (2006.01) | |
| *H01L 35/18* | (2006.01) | |
| *H01L 35/16* | (2006.01) | |

(52) U.S. Cl.
CPC .............. *H01L 23/38* (2013.01); *H01L 35/10* (2013.01); *H01L 35/16* (2013.01); *H01L 35/18* (2013.01); *H01L 35/30* (2013.01)

(58) Field of Classification Search
None
See application file for complete search history.

(56) References Cited

U.S. PATENT DOCUMENTS

| | | | |
|---|---|---|---|
| 6,570,362 B1* | 5/2003 | Estes | ................. H01L 35/00 320/101 |
| 9,312,580 B2* | 4/2016 | Nguyen | ............ H01M 10/6555 |
| 9,754,856 B2* | 9/2017 | Caroff | ................... H01L 23/427 |
| 2003/0062150 A1* | 4/2003 | Sweitzer | ............... H01L 23/427 165/104.33 |
| 2004/0042178 A1* | 3/2004 | Gektin | .................. H01L 23/433 257/E23.09 |
| 2008/0168775 A1* | 7/2008 | Windheim | ............. F25B 21/02 136/200 |
| 2011/0248177 A1* | 10/2011 | Crocker | ............. H01L 31/0203 250/370.15 |

* cited by examiner

*Primary Examiner* — Evren Seven
(74) *Attorney, Agent, or Firm* — Essential Patents Group, LLP

(57) ABSTRACT

An Integrated Circuit (IC) assembly, comprising an IC package coupled to a substrate, and a subassembly comprising a thermal interface layer. The thermal interface layer comprises a phase change material (PCM) over the IC package. At least one thermoelectric cooling (TEC) apparatus is thermally coupled to the thermal interface layer.

23 Claims, 15 Drawing Sheets

US 11,676,883 B2

THERMOELECTRIC COOLERS COMBINED WITH PHASE-CHANGE MATERIAL IN INTEGRATED CIRCUIT PACKAGES

BACKGROUND

Thermal management in integrated circuit (IC) packaging containing single or multiple integrated circuits (ICs) is becoming an increasingly important issue. Packaging for modern high-performance integrated circuits must contend with increasingly larger scale microelectronic circuit integration, including vertical integration of multiple integrated circuits. Smaller form factors are associated with increasingly higher power densities, having concomitant heat transfer challenges. High-performance ICs, such as modern multi-core microprocessor and high-bandwidth memory dies, commonly produce hotspots the die-substrate interconnect level by large current draw through individual signal and power interconnects. Conventionally, heat conduction through-the die itself is relied upon to remove heat from the hotspot to an integrated heat spreader and/or a thermal solution on the top of the die. In many cases, the die itself and thermal interface material offer a large amount of thermal resistance limiting the efficacy of this heat transfer path. High thermal-resistance between dies and thermal solution is especially problematic in package-on package (PoP) architectures where dies are vertically stacked. Heat flow from die packages lower in the stack and thus furthest from a thermal solution may be greatly impeded by PoP packages or dies closer to the thermal solution, potentially overheating the dies. This is particularly important for microprocessors when in burst mode. Demand for higher microprocessor performance in video and gaming applications where repeated or extended bursts are required has necessitated development of advanced thermal management architectures at the package level.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
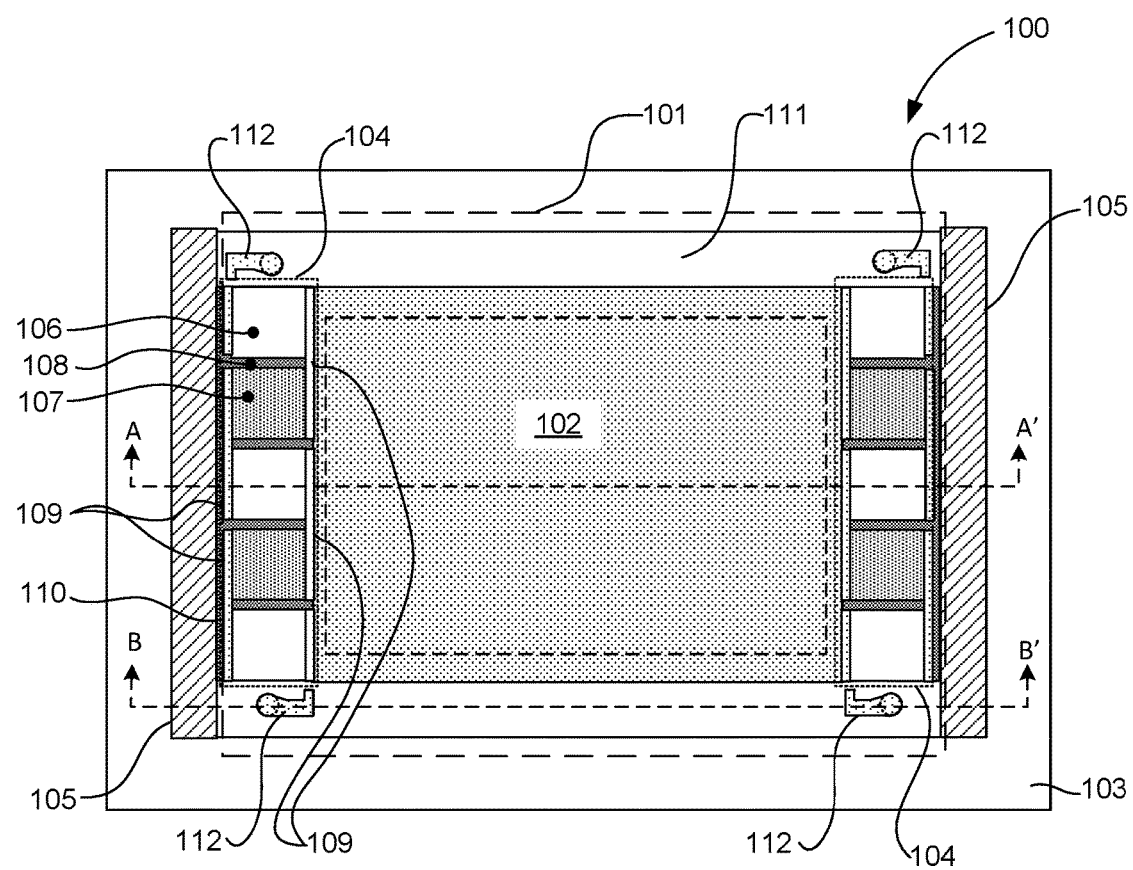
FIG. 1A illustrates a plan view in the x-y plane of an integrated circuit (IC) package assembly, according to some embodiments of the disclosure.

Described herein are embodiments of package-integrated thermoelectric latent heat absorption device to extend architecture for package-level thermal management.

The package-integrated thermoelectric latent heat-absorption device is in part an active thermal interface (ATI), comprising integrated thermoelectric coolers (TECs) thermally coupled to a phase change material (PCM) layer. The PCM layer comprises a solid-phase material that undergoes a solid-liquid phase transition (e.g., melts), or undergoes a thermally-driven solid-state phase transition (e.g., a change in crystalline phase). The PCM layer overlays an active device (die or package) within the IC package, and absorbs the heat generated by the active device.

An active device may be a high-performance microprocessor (e.g., a CPU or a GPU) that exhibits periods of burst activity, where bursts of intense computational activity cause it to generate excessive heat. The generated heat must be rapidly removed, otherwise the device temperature can reach dangerous levels and destroy the device. Particularly for IC packages that employ vertically integrated (stacked)

package-on-package (PoP) architectures, heat removal from high performance devices lower in the stack presents a significant challenge. Current thermal management solutions are generally inadequate to deal with the large heat disposal demand from such packages, which are increasingly more compact and higher performance. As a consequence, the performance of these devices is limited by the current state of thermal regulation.

Advantage may be taken of this phenomenon. A PCM may be employed as a thermal interface disposed between an active device, such as a high-performance CPU, and a thermal solution, such as a heat sink. The PCM has the ability to absorb a large amount of heat generated by the CPU during a period of burst activity in a "turbo" mode of operation, where computational demands on the CPU or GPU may be intense. The excessive heat generated may flow into the PCM by conduction. The PCM may then melt into the liquid state, as the CPU supplies the necessary latent heat of fusion to cause the PCM to melt. A large amount of heat from the CPU may be stored in the PCM during the melting phase, with a small rise in temperature. The small temperature rise of the PCM is advantageous as the temperature gradient for heat flux from the chip into the PCM remains large, permitting a high rate of heat removal from the CPU. The absorbed heat is initially absorbed by PCM and is stored in the material as sensible heat, causing a temperature rise in the PCM. When the temperature reaches the phase transition temperature, the heat is stored as latent heat. Latent heat is the heat absorbed by the material to drive the phase transition, and is thermodynamically defined as the enthalpy change in the material as its state changes (e.g., the enthalpy of fusion is the heat required to melt a solid completely).

Effectively, the heat capacity of the PCM is many times larger during the phase transition than the heat capacity of the PCM when either in the lower temperature phase (e.g., the solid state) or the higher temperature phase (e.g., the liquid state). The amount of latent heat stored during the phase transition may be many times the amount of sensible heat stored when the material is heated in the solid phase or in the liquid phase (e.g., after melting). For this reason, the temperature of the PCM during the phase transition remains substantially constant. For a pure material, the phase transition occurs at a defined temperature. For a mixture, the phase transition occurs over a range of temperatures. Some PCMs comprise a multicomponent mixture and exhibit a phase transition range, such as a melting range of several degrees.

As long as the PCM is undergoing a phase transition such as melting, the rate of heat storage and the amount of heat stored is large in comparison to heat storage in the solid phase or the liquid phase. During the phase change of the PCM, the heat capacity of the PCM may increase by at least an order of magnitude over that of the lower temperature phase (e.g., solid) or the higher temperature phase (e.g., liquid).

By way of example, as the PCM melts to a liquid, its heat capacity plummets from a peak value during the melting phase to a many-times lower liquid state value. If the CPU continues to generate heat after the PCM is melted, as during an extended period of burst activity, the liquid PCM continues to store heat, but the rate of heat storage is diminished. The stored heat is sensible heat resulting in a rapid temperature rise of the liquid PCM. As the temperature of the PCM increases, heat flux into the PCM from the CPU may be drastically diminished, effectively cutting off the CPU's thermal access to an integrated heat spreader (IHS) or a heat sink.

Any thermally-driven phase transition may have a dynamic component. The duration of the phase transition may depend on the rate of heat storage in the material, which may be limited by heat flow into and out of the material. A small heat flux into the material may result in a relatively longer time (duration) for the phase transition to complete in comparison to the melting duration if the material is subjected to a large heat flux.

If the net heat flux (e.g., heat flow in minus heat flow out of the material), is controllable, it is possible to regulate the duration of the phase transition. As an example, the melting phase of a PCM may be prolonged, extending the ability of a PCM to store in-flowing heat as latent heat. A prolonged period of burst activity of a CPU or other active device may be tracked by artificially prolonging the melting phase of the PCM, augmenting thermal management capabilities of CPUs, GPUs and other heat-generating active devices, and enabling these devices to achieve higher performance levels.

According to the disclosed embodiments, the ATI comprises one or more package-level integrated thermoelectric coolers (TECs) which are arranged with the PCM layer such that the cold junctions of the integrated TECs abut the sidewalls or main surfaces of the PCM layer. The integrated TECs are activated during burst activity periods of an active device as the temperature rise is sensed. The package-integrated TECs remove a portion of the heat flowing into the PCM from the active device while the PCM undergoes its phase transition, so that this portion of heat is not stored in the PCM. The heat flow into the PCM is thus effectively reduced, extending the duration of the phase transition. As an example, the melting phase of a PCM is prolonged, delaying the transition to the liquid state.

This is due to the storage of heat entering the material as latent heat, where a zero or small increase in the temperature of the PCM occurs during the phase transition duration. In practical terms, a great amount of the heat flux into the PCM layer from the active device may be stored as latent heat in a thin layer of PCM, accompanied by a very small change in temperature of the material. If the temperature of the PCM remains constant and relatively low compared to the rising temperature of the device during periods of burst activity, heat flux into the PCM from the device may be high.

If the burst activity continues after the phase transition is complete, the excess heat continues to flow into the PCM and is stored as sensible heat until the PCM temperature approaches the temperature of the device. As the temperature of the PCM layer approaches the temperature of the device, heat flux into the PCM diminishes and thermal resistance of the PCM increases. This results in significantly reduced transfer of heat from the device to a thermal solution (e.g., a heat sink).

Active thermoelectric cooling of the PCM by the integrated TECs delays the complete melting of the PCM, enabling an extended period of latent heat absorption by the PCM. Excessive heat generated by the device, such as a high-performance CPU during burst activity may continue to flow into the PCM layer and to be stored there as latent heat for extended durations of the burst activity. Generally, burst activity may last longer than the normal PCM phase change duration that occurs without active thermoelectric cooling. Active thermoelectric cooling of the PCM extends the duration of the phase transition (e.g., melting of the PCM).

The prolonged duration of the phase transition of the PCM by active heat removal mediated by integrated TECs may be regulated by regulation of power input into the TECs. Smart controllers may be interfaced to the integrated TECs to monitor the thermal status of the device and regulate the duration of the phase transition to match or exceed the duration of burst activity in the device, which are becoming increasingly long, potentially lasting minutes, with current and future computational demands.

In this disclosure, several apparatus embodiments of IC packages comprising an ATI are described. System level embodiments comprising implementations of the described IC package embodiments are also described. An exemplary method for making an IC package comprising an ATI is also described.

Here, the term "die" generally refers to a carrier structure for an integrated circuit. The term "die" implies a single unit, to be distinguished from the plural "dice". Throughout this specification, however, the term "dies" will be used as the plural form of "die". A number of identical dies may be "singulated", or diced from a semiconductor wafer, such as a silicon wafer, by mechanical sawing or laser cutting.

Here, the term "package" generally refers to a structure including one or more integrated circuit dies bonded to a suitable substrate, such as a printed circuit board or embedded in a layered substrate (e.g., a bumpless build-up layer (BBUL) package). In common vernacular, an integrated circuit package may be referred to as a "chip", although the term "chip" technically refers to a die in the package. The one or more dies may be encapsulated for protection from the environment in a dielectric material, such as an epoxy resin or a ceramic composite, which is molded into a block. Alternatively, the package may be without encapsulation, allowing the one or more dies to be exposed. The substrate generally comprises electrical interconnects on its bottom surface, which may be a pin array for insertion into a socket, or electrical contact pads for permanent solder-bonding to a printed circuit board, such as a computer motherboard or daughterboard.

Here, the term "assembly" generally refers to an integrated circuit structure or device comprising one or more packages and other components. An example is a stack of separate integrated circuit packages, where one package may be contain a microprocessor and a second package may contain a high-speed memory chip. The package stack may be attached to a common substrate and encapsulated, forming a self-contained package-on-package (PoP) device.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a plan view in the x-y plane of integrated circuit (IC) package assembly 100, according to some embodiments of the disclosure.

IC package assembly 100 is shown as a partial assembly, with the lid of the integrated heat spreader (see FIGS. 1B and 1C) removed, exposing active thermal interface (ATI) subassembly 101, enclosed in the larger dashed outline. Immediately below subassembly 101 in the z-dimension of the figure is an integrated circuit structure, not shown, but indicated by the smaller dashed outline within thermal interface layer 102, described below. The structure is shown in cross section in FIG. 1B. Base substrate 103 is indicated in FIG. 1A as positioned below ATI subassembly 101 (and the integrated circuit structure) in the z-dimension of the figure. This will be described below in the discussion of FIG. 1B.

ATI subassembly 101 comprises thermoelectric cooler (TEC) structures 104 that abut thermal interface layer 102 and integrated heat spreader (IHS) sidewalls 105. TEC structures 104 are shown enclosed within the dotted outlines to indicate that they are sub-assemblies comprising several components, described below. Thermal interface layer 102 comprises a phase change material (PCM). In some embodiments, the PCM is a solid film comprising an organic polymer. In some embodiments, the PCM is a low-melting metal alloy. Suitable PCM compositions are described below. TEC structures 104 abut opposing edges of thermal interface layer 102. TEC structures 104 comprise alternating TEC segments 106 and 107.

Electrodes 109 alternate on opposing outer sidewalls of TEC segments 106 and 107, and interconnect adjacent segment pairs. Adjacent TEC segments 106 and 107 form thermoelectric pairs with complementary conductivities. The thermoelectric pairs may be the basic building blocks of thermoelectric structures 104.

In some embodiments, thermoelectric structures 104 comprise a single thermoelectric pair. Any number of thermoelectric pairs may be concatenated to form thermoelectric structures 104. Thermoelectric structures 104 shown in the illustrated embodiment of FIG. 1A comprise five thermoelectric segments, all paired due to the alternate placement of bridging electrodes 109. The number of thermoelectric segments is not limited to even numbers, and in some embodiments, odd numbers of segments may be employed in thermoelectric structures 104.

Metal/semiconductor junctions formed between electrodes 109 and the thermoelectric material of TEC segments 106 and 107 form thermoelectric junctions on opposite sides of the thermoelectric pair. During operation of the device, voltages applied to electrodes 109 on opposite sides of TEC segments 106 and 107 induce a Peltier effect, where majority charges (e.g., electrons or holes) flowing between positive and negative terminals (away and toward electrodes 109 on opposite sides of the TEC segments 106 and 107) transport heat from one side of the TEC segments to the other, creating hot and cold junctions.

As shown, TEC structures 104 function as Peltier devices, alternatively known as thermoelectric coolers or heat pumps. As Peltier devices, TEC structures 104 deliver heat absorbed at one sidewall (e.g., cold junction) to the opposite sidewall during operation of the device (e.g., hot junction). During operation of the device, the polarity of current flow through the thermoelectric pair(s) may be directed so that one side of the thermoelectric pair(s) is a hot junction to where heat is transported and where from heat is rejected, and the opposing side is a cold junction where heat is absorbed. In some embodiments, TEC structures 104 are operated such that the inner side abutted against thermal interface layer 102 is a cold junction, absorbing heat from thermal interface layer 102. Accordingly, the hot junction of TEC structures 104 is on the opposite side abutting IHS sidewalls 105, where heat may be rejected.

In some embodiments, the thermoelectric material is a doped semiconducting material, having either p-type or n-type conductivity. Suitable thermoelectric materials include, but are not limited to, bismuth chalcogenides, such as bismuth telluride ($Bi_2Te_3$) and bismuth selenide ($Bi_2Se_3$), antimony chalcogenides such as antimony telluride ($Sb_2Te_3$); bismuth-antimony chalcogenide alloys, such as p-type $Bi_xSb_{(2-x)}Te_3$ and n-type $Bi_2Te_{(1-x)}Se_x$; lead chalcogenides such as thallium-doped lead telluride (PbTe) and lead chalcogenide alloys such as p-type $PbTe_{(1-x)}Se_x$, and n-type $Pb(1-x)Sn_xTe$. Suitable thermoelectric materials may further include clathrates such as $Ba_8Ga_{16}Ge_{30}$, or $Ba_8Ga_{16}Si_{30}$ and $Ba_8Ga_{16}Al_3Ge_{27}$; alloys of silicon-germanium ($SixGe_{(1-x)}$) such as $Si_{0.8}Ge_{0.2}$. Suitable thermoelectric materials may further include Skutterudite compounds such as (Co, Ni or Fe)(P, Sb or As) skutterudites, and rare earth-filled skutterudites such as $Ir_4XGe_3Sb_9$, where X is La, Nd or Sm. Suitable thermoelectric materials may further include transition metal oxides such as sodium cobaltite (NaxCoO) and sodium cobaltate ($Na_{0.8}CoO_2$), zinc oxide (ZnO), manganese oxide ($MnO_2$) and niobium oxide ($NbO_2$), half Huesler compounds including NbFeSb, NbCoSn, VFeSb, strontium titanate/strontium oxide ($SrTiO_3$/SrO) Ruddlesden-Popper phase compounds. Suitable thermoelectric materials may further include amorphous systems such as Cu—Ge—Te, In-Ga—Zn—O, Zr—Ni—Sn, Si—Au and Ti—Pb—V—O. Other suitable thermoelectric materials are also possible. N-type and p-type doping of the materials may be done by introduction of heteroatoms or by alloy composition, as shown in the above examples.

Electrically-insulating bonding agent 108 is disposed interstitially between segments 106 and 107 and performs as an adhesive holding segments 106 and 107 together. In some embodiments, bonding agent 108 is a high-thermal conductivity (high-k, where k≥3 W/m° K) adhesive, such as a high-k epoxy composite. Bonding agent 108 may electrically insulate adjacent thermoelectric segments 106 and 107 from each other, preventing short-circuiting between p-type and n-type segments during operation of the device.

In some embodiments, a thermal interface material (TIM) 110 is between IHS sidewalls 105 and electrodes 109. TIM 110 may comprise a thermal grease, or a high-k silicone gel or rubber pad. In some embodiments, TIM 110 is a layer of high-k bonding agent 108 extending over the outer sidewalls of TEC segments 106 and 107 from the interstitial areas between segments.

In some embodiments, the PCM undergoes a solid-to-liquid phase transition. In some embodiments, the PCM comprises a composition of two or more materials as a solid mixture. The multicomponent PCM has a melting range $\Delta T$ of several degrees between a solidus point, below which the PCM is in the solid state, and a liquidus point, above which the PCM is completely liquefied. In some embodiments, the PCM comprises a single material, and has a sharply defined melting point. In alternate embodiments, the PCM may have a solid/solid phase transition where the material remains in the solid state, but a crystalline phase transition may take place within a temperature range $\Delta T$. The phase change is accompanied by absorption of a latent heat of fusion or latent heat of crystalline phase change by the material (e.g., the latent heat of fusion), where the latent heat is stored in the PCM as enthalpy, with a zero or very small $\Delta T$ during the phase change.

For PCMs that have a solid-liquid phase change, the values of latent heat of fusion may be on the order of 200-300 kJ/kg. PCMs may be engineered to have phase transition (e.g., solid-solid or melting) temperatures within desired ranges. Generally, PCM melting temperatures range from −35° C. to +190° C. During the phase transition, and in the high-temperature phase (e.g., the liquid state), the PCM stores the absorbed heat. PCM materials may have a heat storage capacity of five to 14 times greater than conventional heat-storage materials, such as water, or with ceramic materials such as masonry and rock.

Suitable PCMs may be inorganic materials, organic materials or composites thereof. Many materials may be employed as a PCM that have a phase transition temperature point or range that may be substantially a design temperature limit, or lower temperature deemed safe for IC assembly 100. Low-melting metal alloys may be employed, such as eutectics and other alloys comprising gallium and indium. Dielectric molten salts, aqueous and non-aqueous salt solutions (organic and inorganic salts) may be also be employed as PCMs. Organic PCMs may include mixtures comprising mineral hydrocarbon paraffin waxes, other mineral waxes, biologically-derived and non-biologically derived fatty acids, di- and triglycerides, aromatic compounds including anilines and phenols, heteroatomic rings containing nitrogen, sulfur and oxygen, and short and long-chain alcohols and ketones. PCMs may be encapsulated in a polymer or inorganic matrix for facile employment as films or sheets. As an example, polypropylene or high-density polyethylene (HDPE) films, sheets and blocks are suitable encapsulation matrices and deployment vehicles for commercial PCMs comprising inorganic, biological or mineral hydrocarbons and derivatives thereof.

Referring again to FIG. 1A, thermal interface layer 102 is over an IC package or an IC die (e.g., a device), as indicated by the smaller dashed outline in the figure, and as will be described, thermal interface layer 102 and the underlying IC structure are in direct contact. During operation of the device, thermal interface layer 102 absorbs heat from the underlying IC structure, as explained in detail below. TEC structures 104 are abutted against edges of thermal interface layer 102 at one sidewall and abutted against IHS sidewalls 105 on the opposing sidewall. As described above, the device may be operated such that the cold Peltier junction abuts thermal interface layer 102 and the hot Peltier junction abuts IHS sidewalls 105. IHS sidewalls 105 may carry away the stored heat in thermal interface layer 105 absorbed by thermoelectric structures 104.

In some embodiments, thermoelectric structures 104 have thicknesses ranging between 100 microns to 1 mm. As thin thermoelectric structures 104 may be fragile and difficult to handle, ATI subassembly 101 may comprise carrier substrate 111 to provide mechanical support to thermoelectric structures 104, as shown in the illustrated embodiment. In some embodiments, thermoelectric structures 104 grown or formed as separate structures and are attached to carrier substrate 111 by an adhesive such as bonding agent 108. In some embodiments, thermoelectric structures 104 are grown over carrier substrate 111 and adhere by direct chemical or physical bonding.

TEC structures 104 are bonded to carrier substrate 111 either by an intervening adhesive layer or by native chemical bonds formed between the material of carrier substrate 111 and TEC structures 104. In some embodiments, TEC elements 106 and 107 are grown from thermoelectric materials deposited on carrier substrate 111 by methods described below. In alternate embodiments, TEC elements 106 and 107 are grown or otherwise formed on a separate substrate (e.g., separate from carrier substrate 111) and attached to carrier substrate 111 by an adhesive material, such as bonding agent 108, or another suitable adhesive. According to some embodiments, carrier substrate 111 comprises an organic material, such as, but not limited to, a bakelite resin, an epoxy resin, a glass-filled epoxy composite, a carbon-filled epoxy composite. In some embodiments, carrier substrate 111 comprises a ceramic material, such as, but not limited to, fused silica, float glass, borosilicate glass, alumina, sapphire and silicon.

Figure 1B:
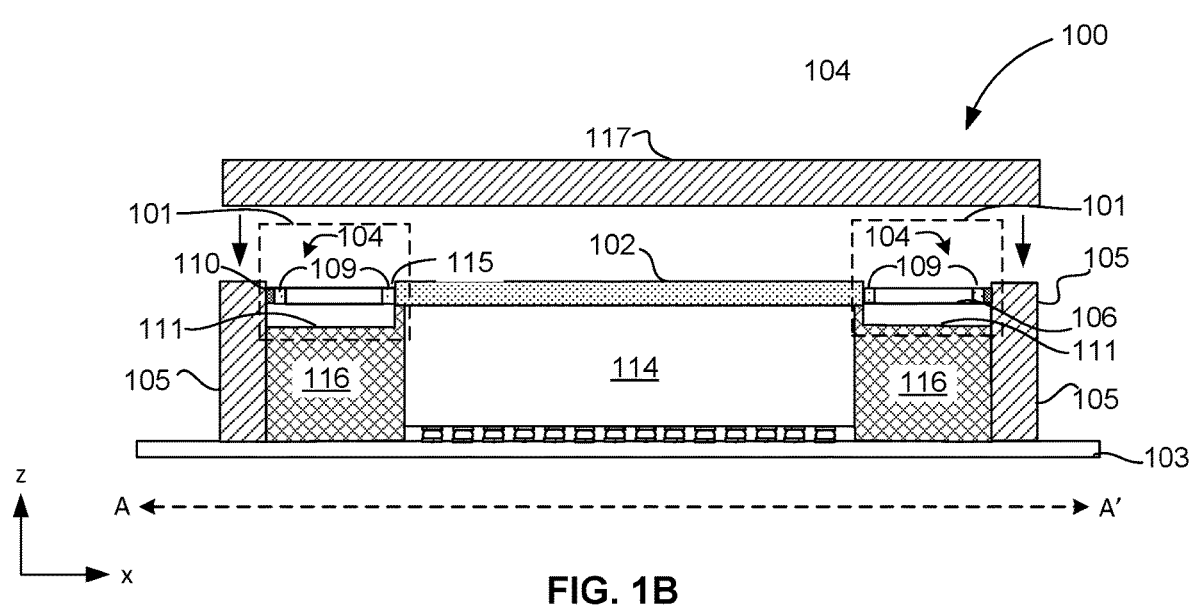
FIG. 1B illustrates a cross-sectional view in the x-z plane of IC structure, according to some embodiments of the disclosure.

In addition to physical support of thermoelectric structures 104, carrier substrate 111 provides an interconnect platform for electrical connections to thermoelectric structures 104. Interconnect traces 112 are disposed near both ends (longitudinally in the y-direction) of each of thermoelectric structures 104. As shown, interconnect traces are in proximity of terminal electrodes 109 on both sides of thermoelectric structures 104. Solder bridges (not shown) may be made between thermal electrodes 109 and a first end of interconnect traces 112 for electrical bonding. A second end of interconnect traces 112 may terminate at vias (not shown) extending downward in the z-direction in the figure to base substrate 103 (FIG. 1B). In some embodiments, carrier substrate 111 is a printed circuit board.

FIG. 1B illustrates a cross-sectional view in the x-z plane of IC structure 100, taken along section A-A' in FIG. 1A, according to some embodiments of the disclosure.

The cross-sectional view of FIG. 1B shows thermal interface layer 102 directly over IC die 114, represented by the large dashed outline in FIG. 1A. As shown in the illustrated embodiment, TEC structures 104 have large width-to-height (x to z dimension ratio) cross-sectional aspect ratios, as shown in the illustrated embodiment. In some embodiments, TEC structures 104 have a z-height between 100 and 1000 microns, and a width of 500 to 3000 microns extending in the x-dimension between electrodes 109 on opposite sidewalls. As the direction of current flow within TEC segments 106 (and TEC segments 107, not shown) is along the larger dimension between electrodes 109, the overall resistance of TEC structures 104 to current flow is proportional to the width and inversely proportional to the z-height. Thus, in some embodiments, the width-to-height aspect ratio of TEC segments 106 (and 107) may be less than 5. As an example, the z-height may be 500 microns and the width may be 2 mm.

In some embodiments, the z-height of TEC structures 104 is substantially the same as the z-height (thickness) of thermal interface layer 102. Thicknesses of thermal interface layer 102 may be between 100 microns and 1000 microns. In some embodiments, the z-height of TEC structures 104 is less than the z-height of thermal interface layer 102. Limiting the z-height of TEC structures 104 to that of thermal interface layer 102 may optimize the overall efficiency of IC assembly 100. TEC structures 104 abut sidewalls 115 of thermal interface layer 102. During operation of the device, heat transfer from thermal interface layer 102 into TEC structures 104 may be maximized when the z-height of thermal interface layer 102 is equal to or less than the z-height of TEC structures 104. Heat-pumping efficiency of the thermal junctions formed at electrodes 109 may be maximized when the z-heights of TEC structures 104 is equal to or less than the z-height of thermal interface layer 102. Maximal overall efficiency may be obtained when the z-heights of both TEC structures 104 and thermal interface layer 102 are closely matched. In addition, design requirements to minimize overall package thickness may impose thickness constraints on thermal interface layer 102, and on the overall thickness of ATI subassembly 101.

Referring again to FIG. 1B, the cross-sectional view shows TEC structures 104 on carrier substrate 111. In some embodiments, carrier substrate 111 provides mechanical support for TEC structures 104. As described below, TEC structures 104 may be assembled on carrier substrate 111 in a separated manufacturing line, forming ATI subassembly 101 (indicated by dashed outline). IC structure 100 may be assembled by integration of ATI subassembly 101 over IC die 114, shown embedded in dielectric 116 surrounding IC die 114. In some embodiments, dielectric 116 is a dielectric molding material (e.g., an epoxy or epoxy/ceramic composite). In some embodiments, dielectric 116 is a build-up layer dielectric, comprising laminates of dielectric that are overlaid to form a build-up package substrate, such as a bumpless build-up layer (BBUL) package substrate.

In the illustrated embodiment, dielectric 116 is flush with the surface of IC die 116, and an area recessed to seat carrier substrate 111 such that electrodes 109 are aligned with sidewalls 115. In some embodiments, dielectric 116 may partially embed IC die 114, forming a recessed shelf (see FIG. 9C) a distance below the top of IC die 114 to seat carrier substrate 111 such that sidewalls 115 are aligned with electrodes 109 of TEC structures 104.

Outer portions of TEC structures 104 abut IHS sidewalls 105. In some embodiments, TIM 110 intervenes between electrode 109 and IHS sidewalls 105. As mentioned above, hot junctions are formed at the electrode 109 facing IHS sidewalls 105 during operation of the device. In this configuration, IHS sidewalls 105 may dissipate heat rejected by TEC structures 104 by several mechanisms. Heat collected from thermal interface layer 102 and transferred through TEC structures 104 may be radiated or convected into the surrounding environment. Another heat flow path is by conduction through HIS sidewalls to IHS lid 117. IHS lid 117 is shown disassembled from IHS sidewalls 105 in the illustrated embodiment.

The downward-pointing arrows indicate that in the assembled state, IHS lid 117 seats over IHS sidewalls 105 and over thermal interface layer 102. In FIG. 1D, IHS lid 117 is shown to be integral with HIS sidewalls 105, forming a complete heat spreader (IHS), (IHS 125 in FIG. 1D). In some embodiments, IHS 117 provides a heat conduction path to a thermal solution, such as a heat sink, when IC assembly 100 is mounted. This is described below.

Figure 1C:
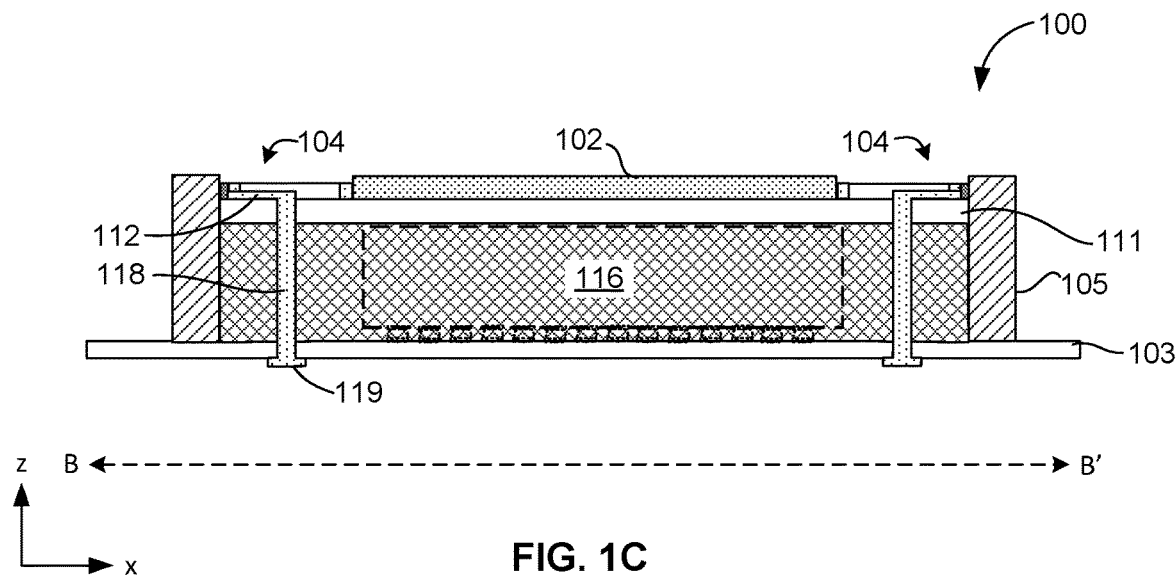
FIG. 1C illustrates a cross-sectional view in the x-z plane of an IC assembly, according to some embodiments of the disclosure.
Figure 1D:
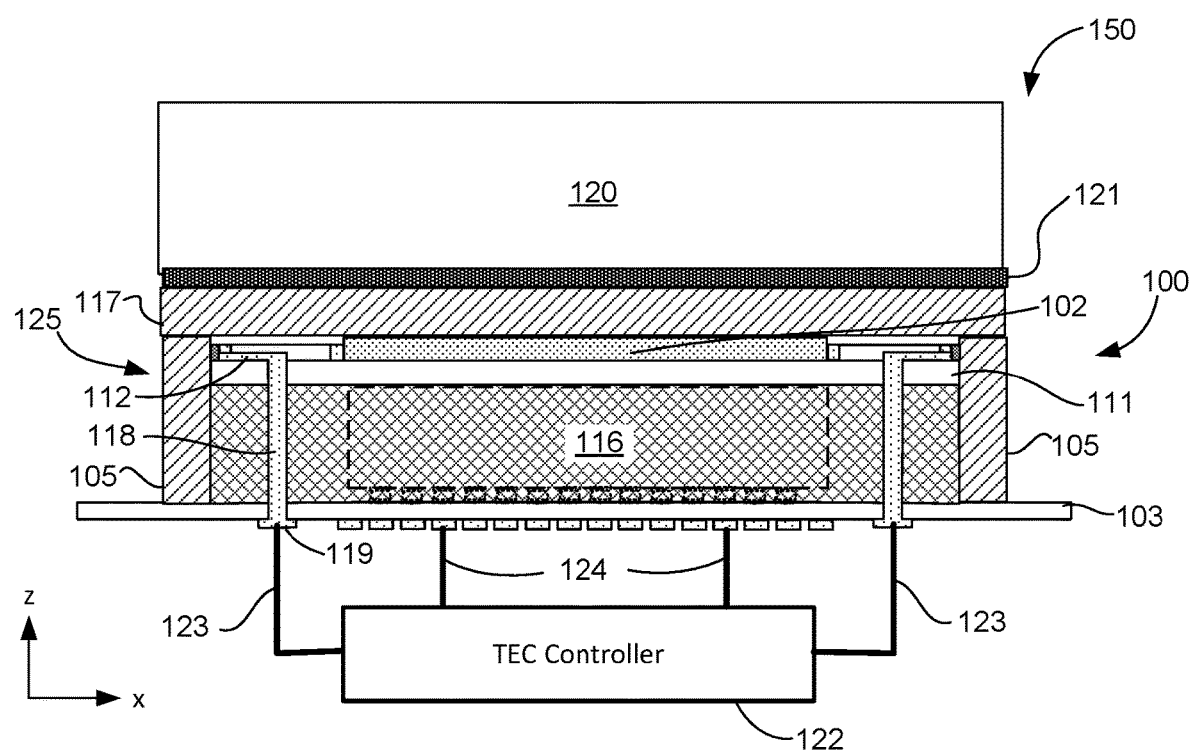
FIG. 1D illustrates a cross-sectional view in the x-z plane of a mounted assembly comprising an IC assembly and a heat sink, according to some embodiments of the disclosure.

FIG. 1C illustrates a cross-sectional view in the x-z plane of IC assembly 100, taken along section line B-B' in FIG. 1A, according to some embodiments of the disclosure.

Section line B-B' crosses interconnect traces 112, shown in plan view in FIG. 1A. The cross-sectional view of FIG. 1C shows an exemplary electrical interconnect architecture for powering TEC structures 104 within IC assembly 100. Vias 118 extend vertically in the figure (z-direction) from interconnect traces 112 through dielectric 116 to base substrate 103. As shown in the illustrated embodiment, vias 118 extend through base substrate 103 and terminate at contact interconnects 119 under base substrate 113. In some embodiments, contact interconnects 119 are solder bond pads that may be part of a ball grid array for IC structure 100, as shown. In some embodiments, contact interconnects 119 are pins to plug IC structure 110 into a socket on a motherboard.

In the illustrated embodiment, it is understood that the architecture shown in the x-z plane of FIG. 1C along section B-B' is reflected below the plane of the figure on the opposite side of TEC structures 104. In manner similar to the architecture revealed in section B-B', vias 118 extend as vertical interconnects from each of interconnect traces 112 that are behind TEC structures 104 (below the plane of the figure) and terminate at contact interconnects 119.

Placement of vias 118 with respect to electrodes 109 may be centered between both sidewalls 115 of TEC structures 104 as shown, but placement may be arbitrary. Interconnect traces 112 are integral with vias 118 and extend laterally over carrier substrate 111 to align one end with electrodes 109. In some embodiments, a solder bridge (not shown) may be made during assembly to bridge traces 112 with electrodes 109.

FIG. 1D illustrates a cross-sectional view in the x-z plane of mounted assembly 150 comprising IC assembly 100 and heat sink 120, according to some embodiments of the disclosure.

FIG. 1D shows IC assembly 100 having lid 117 on IHS sidewalls 105, forming IHS 125. In some embodiments, IHS sidewalls 105 are anchored to base substrate 103 and IHS lid 117 is bonded to IHS sidewalls 105 by solder bonding. In some embodiments, IHS sidewalls are extensions of lid 117, where IHS lid 117 and sidewalls are a contiguous piece of metal. IHS Lid 117 and IHS sidewalls 105 comprise metals such as, but not limited to, copper, alloys of copper, aluminum, steel and alloys of steel. IHS lid 117 is interfaced to thermal interface layer 102, which is interfaced to an IC die (e.g., IC die 114), which is indicated by the dashed hidden outline within dielectric 116.

In some embodiments, heat sink 120 is interfaced to IHS lid 117, and IHS 125 through thermal interface material (TIM) layer 121. TIM layer 121 may be a thermal grease or a thermal pad. During operation of the device, heat generated by the IC die may follow a passive thermal path to heat sink 120 through TIM layer 121.

In some embodiments, an operational system comprises TEC controller 122. Power terminals 123 of TEC controller 122 may be coupled to TEC structures 104 through pads 119 and vias 118. TEC controller may have temperature sensor terminals 124 that are coupled to sensors within the IC die to monitor the temperature status of various parts of the IC die. The temperature at the interface between the IC die and thermal interface layer 102 may be monitored. In some embodiments, an external temperature sensor is disposed within thermal interface layer 102, or at the interface between the IC die and thermal interface layer 102. When there may be a sudden rise in the temperature during a burst where a large power surge into the IC die occurs, TEC controller 122 may apply power to the TEC structures 104 for active thermoelectric cooling of thermal interface layer 102. In some embodiments, TEC structures 104 are activated before the solidus temperature of the PCM is reached. The details of thermal management by active thermoelectric cooling of a PCM is described below.

Figure 2A:
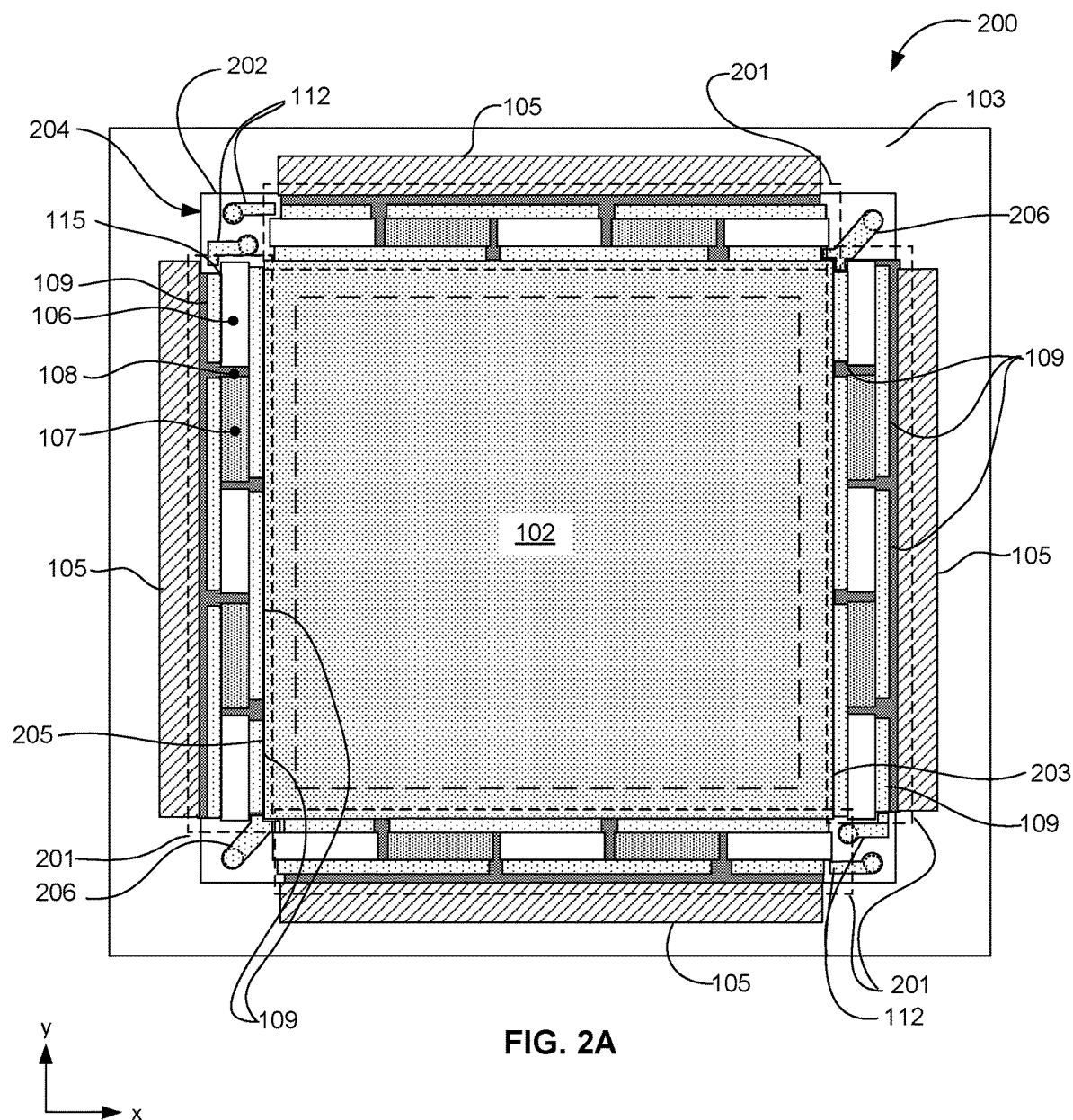
FIG. 2A illustrates a plan view of an IC structure, according to some embodiments of the disclosure.

FIG. 2A illustrates a plan view of IC structure 200, according to some embodiments of the disclosure.

In the illustrated embodiment shown in FIG. 2A, four TEC structures 201, indicated by the dashed outlines, abut all edges of thermal interface layer 102. Similar to TEC structures 104, TEC structures 201 comprise TEC segments 106 alternating with TEC segments 107, separated by bonding agent 108. TEC segments 106 and 107 may comprise a p-type and a n-type semiconducting thermoelectric material, respectively. The suitable thermoelectric materials for TEC segments 106 and 107 are described above. In the illustrated embodiment, TEC segments 106 and 107 are depicted as having a shortened x-dimension relative to their geometry depicted in FIG. 1A. The particular geometry of TEC segments is not to be construed as limiting in the disclosed embodiments. Electrodes 109 on opposing sidewalls of TEC segments 106 and 107 bridge adjacent p-type and n-type segments to form thermoelectric pairs. In some embodiments, bonding agent 108 is an electrically insulating but thermally conductive (e.g., hi-k) adhesive, joining alternating TEC segments 106 and 107 along adjacent non-active sidewalls, perpendicular to the active sidewalls (e.g., sidewalls 115) integral with electrodes 109.

TEC structures 201 abut heat dissipation structures 105, distributed on all four sides of thermal interface layer 102. As described above for IC structure 100, heat dissipation structures 105 are passive thermally conductive structures that provide a thermal sink for heat rejected from TEC structures 104 due to their high thermal conductivity k (e.g., $k \geq 1000$ W/mK) and thermal mass. In some embodiments, heat dissipation structures 105 are IHS or thermal solution sidewalls extending downward from a IHS lid (e.g., IHS lid 117 shown in FIGS. 1B and 1C). In some embodiments, heat dissipation structures 105 are metallic shielding structures, such as electromagnetic interference (EMI) shield plates. In some embodiments, heat dissipation structures 105 may be anchored to base substrate 103 and extend as walls (e.g., IHS sidewalls or EMI shield sidewalls or plates) vertically above base substrate 103. Other structures may be employed. Suitable materials for thermal dissipation structures 105 include, but are not limited to, copper, aluminum, and copper-molybdenum alloys.

TEC structures 201 are bonded to carrier substrate 202 either by an intervening adhesive layer or by native chemical bonds formed between the material of carrier substrate 202 and TEC structures 201. In some embodiments, TEC elements 106 and 107 are grown from thermoelectric materials deposited on carrier substrate 202 by methods described below. In alternate embodiments, TEC elements 106 and 107 are grown or otherwise formed on a separate substrate (e.g., separate from carrier substrate 202) and attached to carrier substrate 202 by an adhesive material, such as bonding agent 108, or another suitable adhesive. According to some embodiments, carrier substrate 202 comprises an organic material, such as, but not limited to, a bakelite resin, an epoxy resin, a glass-filled epoxy composite, a carbon-filled epoxy composite. In some embodiments, carrier substrate 202 comprises a ceramic material, such as, but not limited to, fused silica, float glass, borosilicate glass, alumina, sapphire and silicon.

In some embodiments, carrier substrate 202 comprises a frame structure surrounding aperture 203 in the center. Aperture 203 frames thermal interface layer 102 that overlays an IC die (e.g., IC die 114 in FIG. 1B) indicated by the hidden outline. In some embodiments, thermal interface layer 102 is attached to carrier substrate 202 on the perimeter of aperture 203, where the distance between the edge of aperture 203 and the edge of electrodes 109 on the inner sidewall is a lip to which thermal interface layer 102 may be attached. As mentioned above, thermal interface layer 102 has a thickness that ranges between 100 microns to 1000 microns. Thermal interface layer 102 may exhibit sufficient rigidity to be self-supporting without an IC die or other supporting structure underneath, allowing it to be transported before assembly into IC structure 200. In some embodiments, thermal interface layer 102 is part of a subassembly that comprises carrier substrate 202 and TEC structures 201, shown as a separate structure in FIG. 2B as ATI subassembly 204.

Electrical interconnects for TEC structures 201 are arranged at the corners of carrier substrate 202, according to some embodiments. Other suitable configurations of interconnect placement are possible. In the illustrated embodiment, each of the four TEC structures 201 is coupled to a single interconnect through a terminal electrode 109 on an outer sidewall 115. Two interconnect traces 112 are disposed at each of a first set of two opposite corners of carrier substrate 202. Similarly, electrodes 109 on an inner sidewall 205 are coupled to interconnect traces 206 disposed on each of a second set of two opposite corners of carrier substrate 201. Interconnect traces 206 may bifurcate into a Y-shape or a V-shape (other suitable shapes are possible) such that a single trace 206 is coupled to two adjacent TEC structures 201, oriented orthogonally to one another as shown in the figure.

Interconnect traces 112 and 206 terminate at vias (e.g., vias 118 in FIG. 1C) that extend vertically (z-direction) below carrier substrate 202 to base substrate 103. In some embodiments, a dielectric material (e.g., dielectric 116 in FIGS. 1B and 1C, not shown in FIG. 2A) is present under carrier substrate 202. The dielectric material may support carrier substrate 202, as described above for FIGS. 1B and 1C, and encapsulate an underlying die. Vias extending vertically between carrier substrate 202 and base substrate 103, similar to vias 118 shown in FIGS. 1C and 1D, may terminate at contact interconnects (e.g., contact interconnects 119 in FIG. 1C, not shown in FIG. 2A) for power connections on a motherboard. As described above for contact interconnects 119, base substrate 103 may support a ball grid array or a pin grid array on its land side (hidden in FIG. 2A).

Figure 2B:
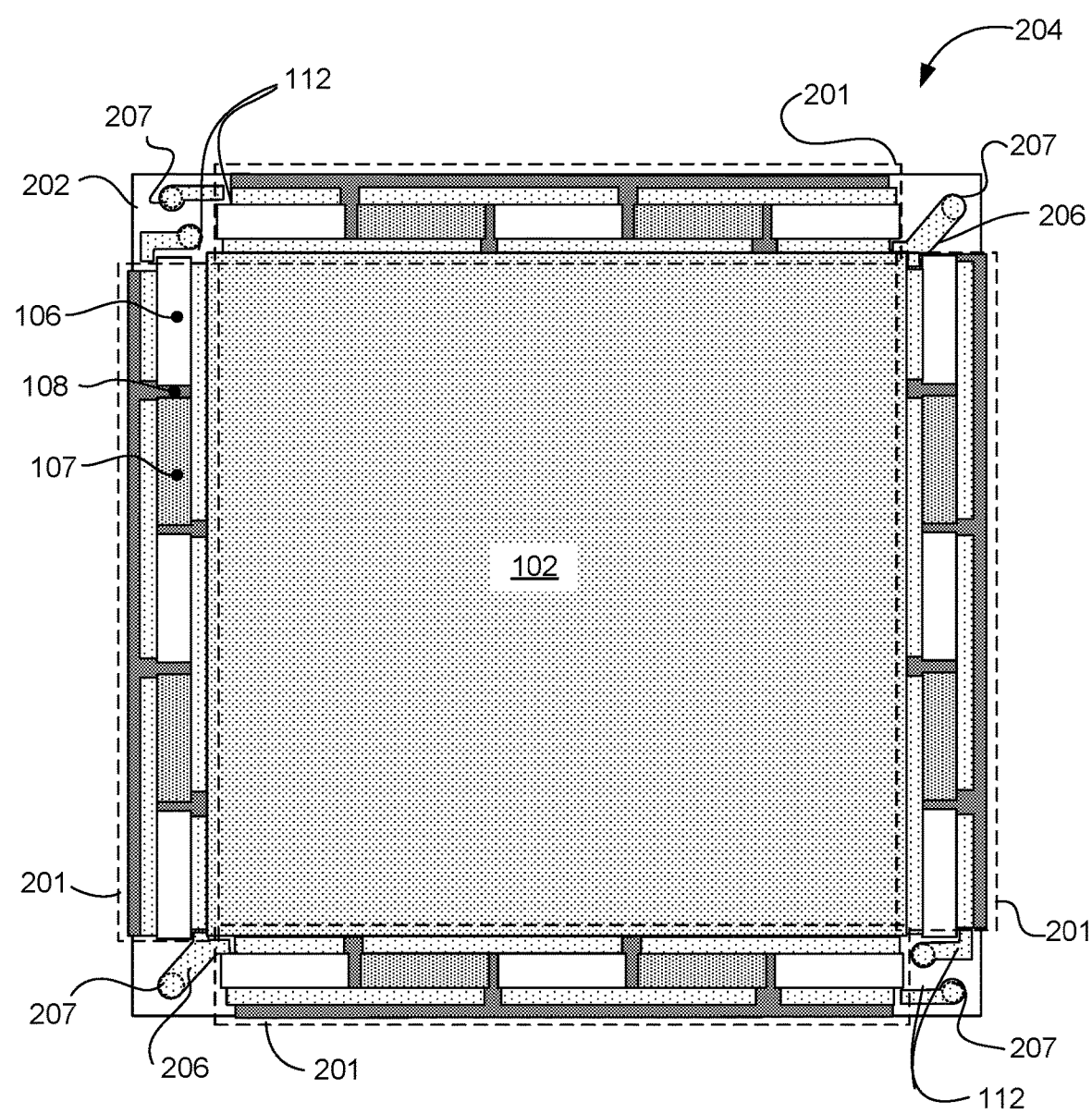
FIG. 2B illustrates a plan view in the x-y plane of an ATI subassembly as a standalone structure, according to some embodiments of the disclosure.

FIG. 2B illustrates a plan view in the x-y plane of ATI subassembly 204 as a standalone structure, according to some embodiments of the disclosure.

In FIG. 2B, ATI subassembly 204 is shown as a stand-alone package component that may be fabricated in a separate process, and assembled into IC structure 200 as a unitary component. ATI subassembly 204 comprises carrier substrate 202 integral with TEC structures 201, as described above. In some embodiments, carrier substrate 202 has a picture frame construction around aperture 203. In some embodiments, thermal interface layer 102 is attached to carrier substrate 202 along the perimeter of aperture 203. In some embodiments, thermal interface layer 102 is incorporated into aperture 203 after subassembly 204 is incorporated into an IC package (e.g., IC structure 200).

Interconnect traces 112 and 206 are metal structures disposed at the corners on carrier substrate 202. The general description of interconnect traces 112 and 206 is given above. In some embodiments, interconnect traces 112 and 206 are integral with vias 207 extending through apertures disposed at the corners of carrier substrate 202. When assembled into an IC package, vias 207 may be solder-bonded to package vias (e.g., vias 118) extending orthogonally (e.g., in the z-direction) in an IC package assembly (e.g., IC structure 200).

As described above, carrier substrate 202 may comprise an organic material such as, but not limited to, an epoxy resin, a bakelite resin, an epoxy resin composite. Carrier substrate 202 may comprise an inorganic material such as, but not limited to, alumina, sapphire, silicon, fused silica, float glass and borosilicate glass. In some embodiments, carrier substrate 202 has a thickness ranging between 500 microns to 2000 microns.

In some embodiments, TEC structures 201 are bonded to carrier substrate 202 on the perimeter of aperture 203. In some embodiments, TEC structures 201 are attached to carrier substrate 202 by an adhesion layer comprising a suitable adhesive (e.g., bonding agent 108). In some embodiments, TEC segments 106 and 107 are grown or deposited directly on carrier substrate 202, with chemical bonds and/or molecular forces providing adhesion.

Figure 3A:
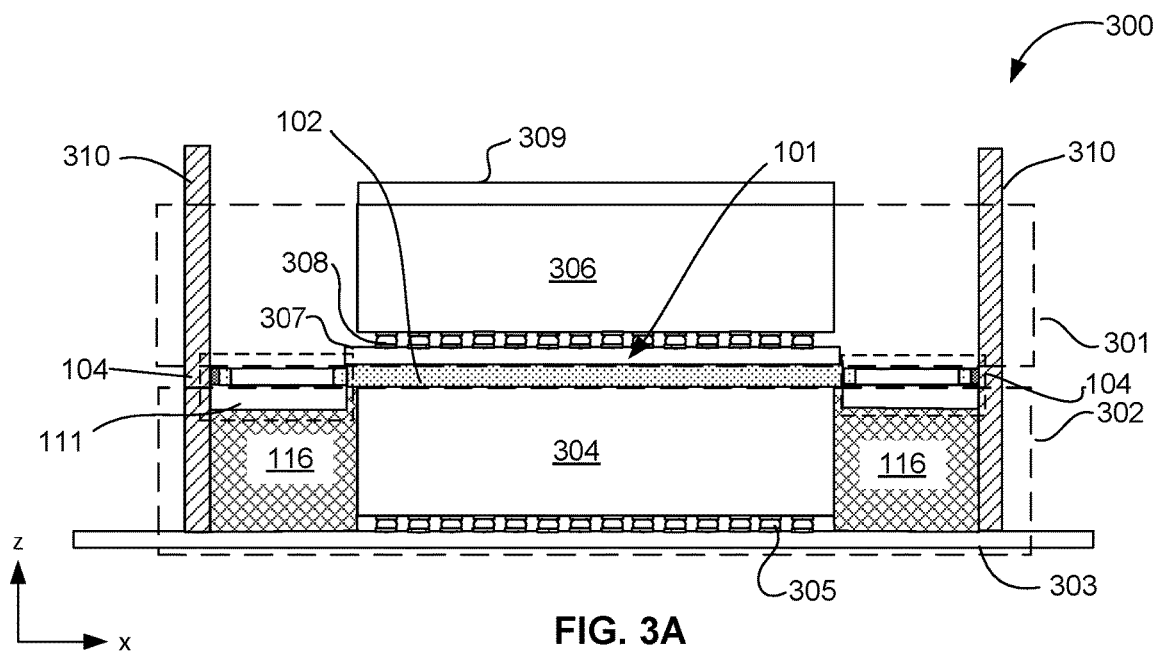
FIG. 3A illustrates a cross-sectional view in the x-z plane of a package-on-package (PoP) assembly incorporating an active thermal interface subassembly according to some embodiments of the disclosure.
Figure 3B:
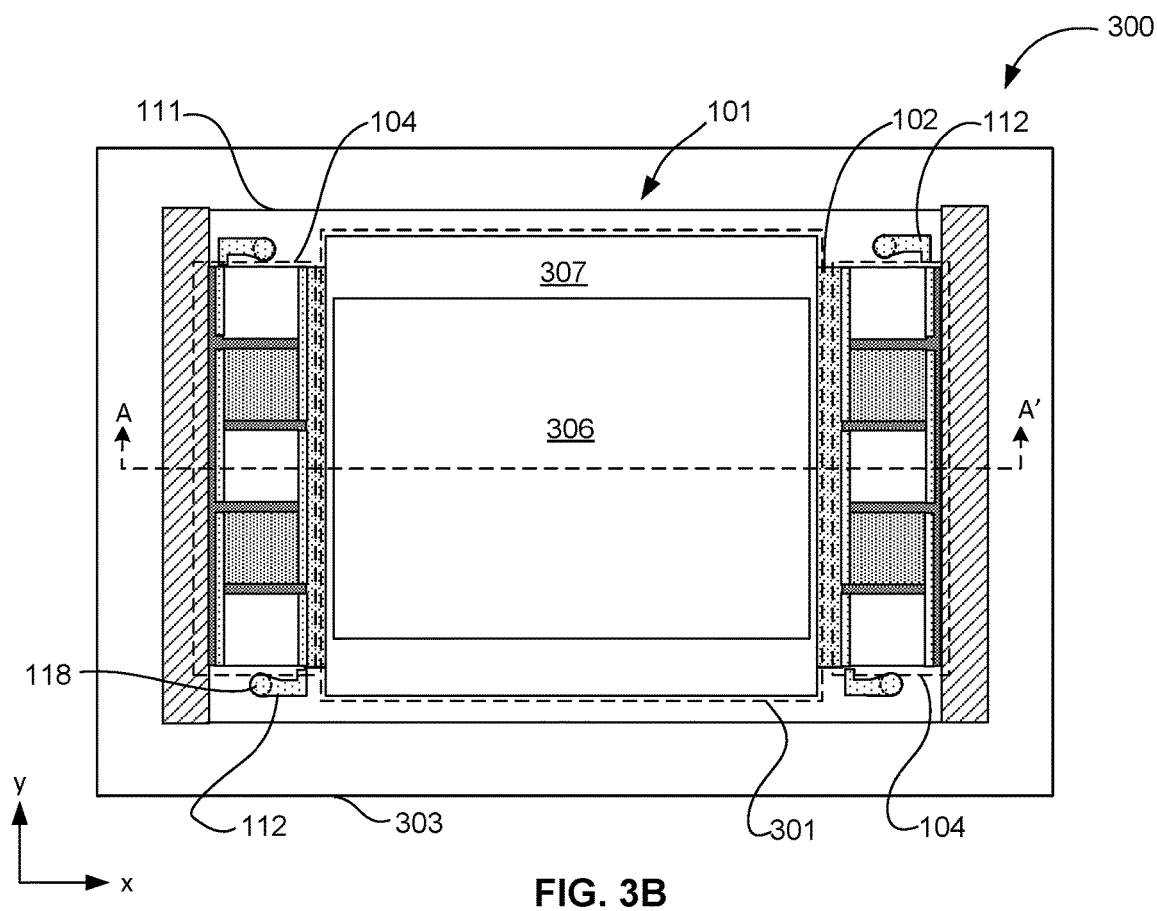
FIG. 3B illustrates a plan view in the x-y plane of a package-on-package (PoP) assembly incorporating an active thermal interface subassembly, according to some embodiments of the disclosure.

FIG. 3A illustrates a cross-sectional view in the x-z plane of package-on-package (PoP) assembly 300 incorporating active thermal interface subassembly 101 along cut A-A' of FIG. 3B, according to some embodiments of the disclosure.

PoP assembly 300 comprises a first IC package 301 stacked over a second IC package 302, and both packages are vertically integrated into IC package assembly 300. Active thermal interface subassembly (e.g., subassembly) 101 is between IC package 301 and 302, where subassembly 101 has been described above (see description accompanying FIGS. 1A-C). Lower IC package 302 comprises IC die 304 bonded to base substrate 303 through solder joints 305. IC die 304 may be embedded by dielectric 116, which is further cemented to base substrate 303. Upper IC package 301 comprises IC die 306 coupled to upper substrate 307 through solder joints 308. IC die 306 may also be embedded in dielectric 116.

In some embodiments, TIM 309 is disposed over IC die 306. TIM 309 may be a thermal grease, gel or thermal pad that is interfaced with a thermal solution (not shown) in the form of an IHS and/or heat sink. IC die 306 is coupled to the thermal solution directly or through TIM 309 (if present). Although not shown in FIG. 3A, a thermal solution coupled to the upper IC die 306 through TIM 309, and may dispose of a large fraction of any heat that may be generated by IC die 306 during operation of the IC package assembly 300. In conventional PoP packaging, heat generated by lower IC die 304 may be blocked by upper IC package 301 (including substrate 307) from reaching the thermal solution. Excessive buildup of heat may result, possibly causing overheating of IC die 306. This situation is commonly encountered in PoP packaging, and often limits performance of the packaged devices.

In PoP assembly 300, active thermal interface (ATI) subassembly 101 is positioned such that thermal interface layer 102 overlays lower IC die 304 and lower IC package 304. ATI subassembly 101 may intercept a substantial fraction of the heat generated by IC die 304 and actively dispose of it through laterally positioned TEC structures 104 (shown in FIG. 3B), as described above. Thermal dissipation structures 310 extend from base substrate 303, against which TEC structures 104 abut. Thermal dissipation structures 310 may be IHS sidewalls or EMI plates and have been described above in greater detail. In some embodiments, thermal dissipation structures 310 are attached to base substrate 303, but may extend downward over base substrate 303 from an IHS lid (e.g., IHS lid 117 in FIG. 1C) that is disposed over TIM 309.

Substrate 307 of upper IC package 301 may be attached to ATI subassembly 101 by a suitable attach adhesive. In some embodiments, substrate 307 is bonded to carrier substrate 111 through a suitable adhesive (shown in FIG. 3B). Electrical interconnects may be made by vias (e.g., vias 118 in FIG. 1C) extending through dielectric 116 to base substrate 303, as described above.

FIG. 3B illustrates a plan view in the x-y plane of Package-on-Package (PoP) assembly 300 incorporating active thermal interface subassembly 101, according to some embodiments of the disclosure.

In the illustrated embodiment, substrate 307 of upper IC package 301 overlaps the top and bottom horizontal segments (orientation in the figure) carrier substrate 111 of ATI subassembly 101. Substrate 307 may be attached to carrier substrate 111 by a suitable adhesive. In some embodiments substrate 307 and thermal interface layer 102 may be separated by a small gap. In some embodiments, thermal interface layer 102 and substrate 307 are in direct contact so that some heat generated by lower IC die 304 or package 302 may be transferred through upper IC package 301.

ATI subassembly 101 is below IC package 301. TEC structures 104 are configured as described above for active lateral transfer of heat from thermal interface layer 102 to thermal dissipation structures 105. Interconnect traces 112 are configured to couple to electrodes 109 on both sidewalls of TEC structures 104 by solder bridges (not shown). Traces 112 extend to vias (e.g., vias 118 in FIG. 1C), to tops of which are shown at the wide ends of traces 112. Vias 118 extend in the z-direction to base substrate 303 and terminate in land side interconnects.

Figure 3C:
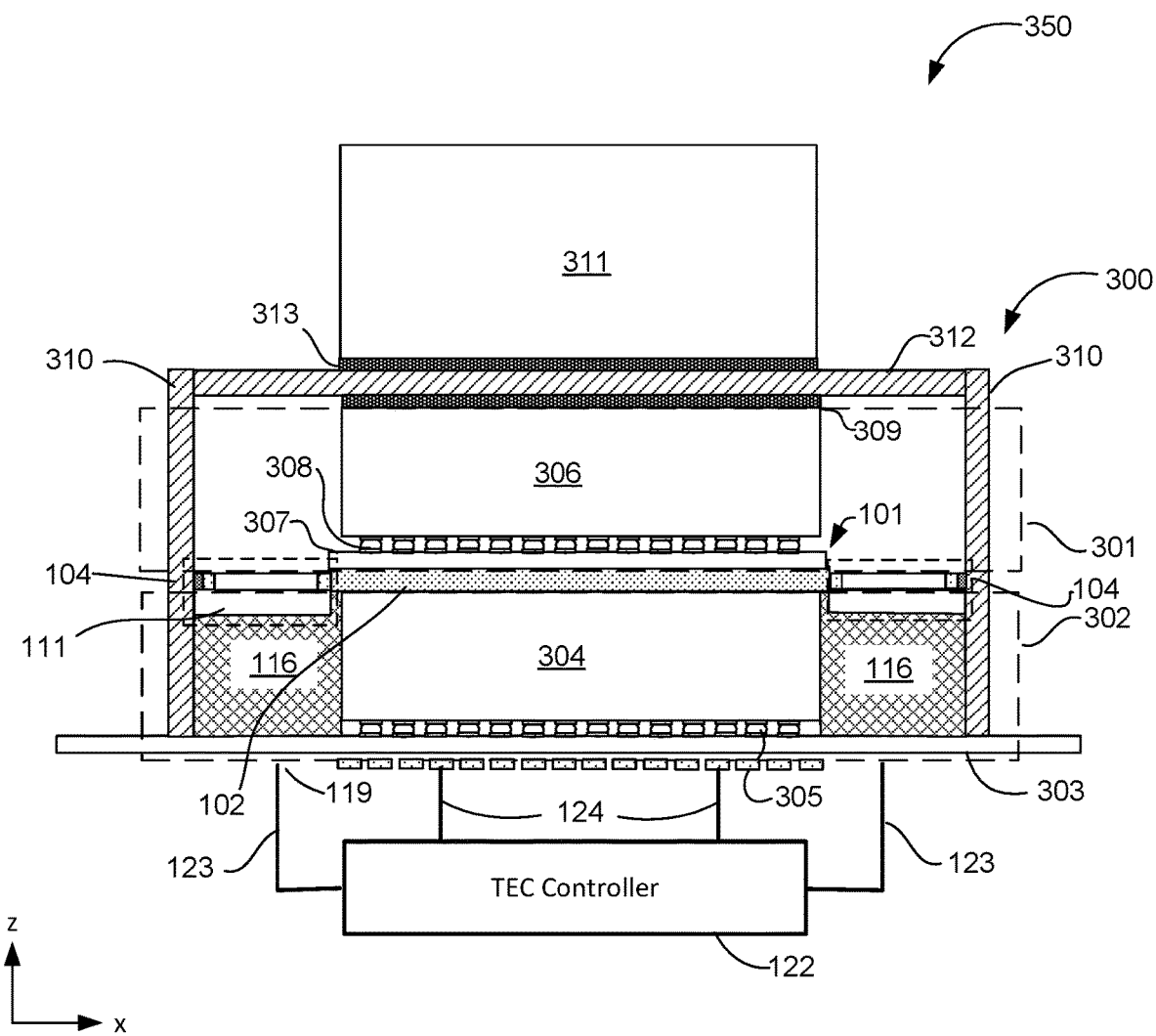
FIG. 3C illustrates a cross-sectional view in the x-z plane of a mounting assembly comprising a PoP assembly, according to some embodiments of the disclosure.

FIG. 3C illustrates a cross-sectional view in the x-z plane of mounting assembly 350 comprising PoP assembly 300, according to some embodiments of the disclosure.

In FIG. 3C, an exemplary implementation of IC package assembly 300, where IC package assembly 300 is incorporated in mounting assembly 350 as a package and thermal solution is shown. EMI housing is completed by EMI cover 312 integrated with EMI walls 310. EMI cover 312 may extend over upper IC die 306, as shown in the illustrated embodiment. TIM layer 309 is interfaced to upper IC die 306 and EMI cover 312. In some embodiments, EMI cover 312 may interface directly with TIM layer 309, where EMI cover 312 is combined with EMI plates 310 to form an IHS. Heat sink 311 may be thermally coupled to EMI cover 312 through TIM layer 313.

TEC structures 104 abut EMI plates 310, where EMI plates may carry heat rejected by TEC structures 104 to EMI cover 312 and to heat sink 311 during operation of the device. Heat within EMI plates 310 may also be radiated and transferred by natural or forced convection. Heat generated by lower IC die 304 may be conducted into surrounding dielectric 116 and into base substrate 113. Thermal interface layer 102 within ATI subassembly 101 may provide a lower resistance thermal path for heat generated within lower IC die 304 through the PCM. TEC structures 104 may provide active thermoelectric cooling to thermal interface layer 102 during operation of the device. The effect of active thermoelectric cooling provided TEC structures 104 on thermal management IC assembly 100 during burst activity of lower IC die 304 (e.g., IC die 304 is a microprocessor) is described below.

Power may be supplied to TEC structures 104 by TEC controller 122 through power terminals 123 connected to pads 119 and vias extending through dielectric 116 (e.g., vias 118, not shown) as described similarly for the system illustrated in FIG. 1D. TEC controller 122 may be coupled to temperature sensors though temperature sensor terminals 124. Details for operation of TEC structures 104 by TEC controller 122 are described below.

Figure 4A:
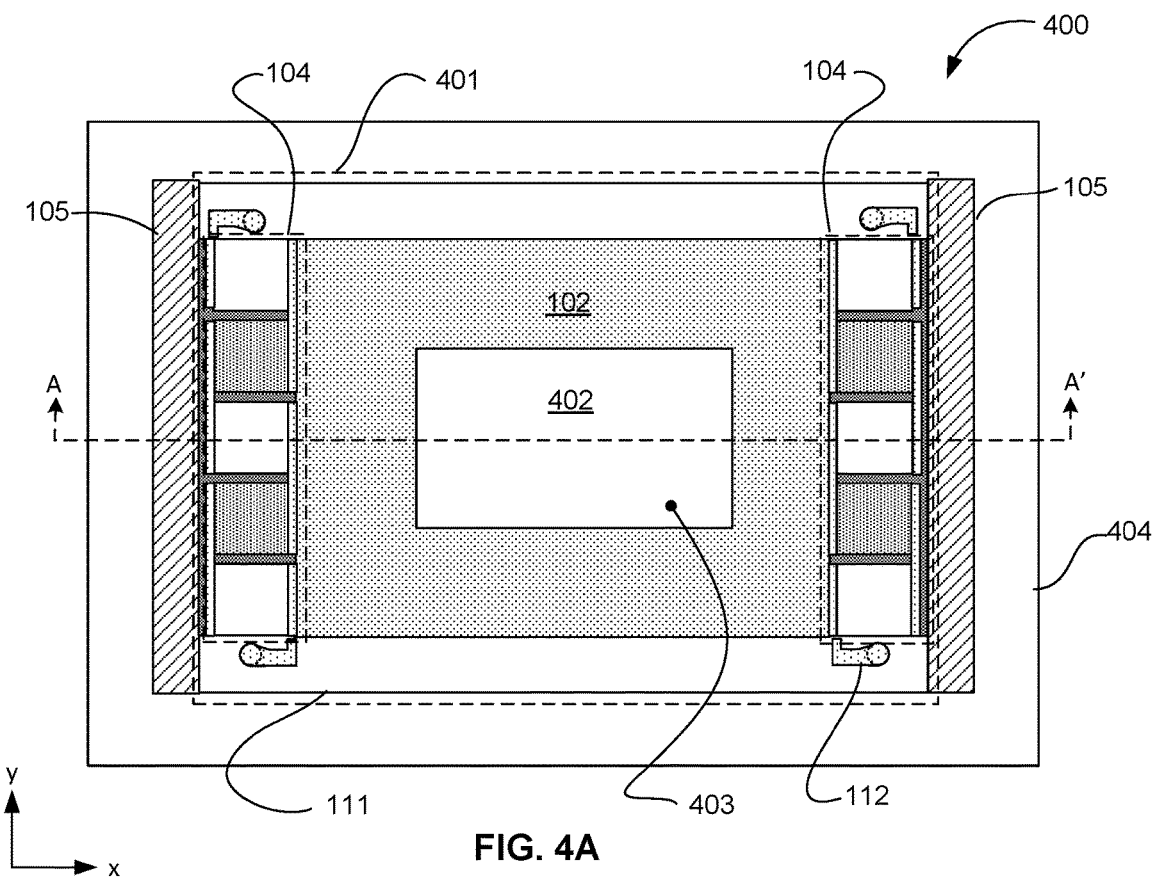
FIG. 4A illustrates a plan view in the x-y plane of an IC package assembly, having a bare IC die, according to some embodiments of the disclosure.

FIG. 4A illustrates a plan view in the x-y plane of IC package assembly 400, having bare IC die 402, according to some embodiments of the disclosure.

IC package assembly 400 comprises ATI subassembly 401, wherein bare IC die 402 is embedded within thermal interface layer 102. In some embodiments, top surface 403 of IC die 402 is above thermal interface layer 102. In alternate embodiments, thermal interface layer 402 covers top surface 403, forming a TIM (not shown) over surface 403. ATI subassembly 401 is configured similarly to ATI subassembly 101. As in the earlier-described embodiments, TEC structures 104 sidewalls (e.g., sidewalls 115 in FIG. 2A) abut thermal interface layer 102 and thermal dissipation structures 105 for lateral heat transfer from thermal interface layer 102 to thermal dissipation structures 105. IC die 402 is directly contacted with the PCM of thermal interface layer 102, permitting heat transfer from multiple surfaces of IC die 402.

In some embodiments, ATI subassembly 401 comprises carrier substrate 111 having a rectangular aperture (e.g., aperture 115 in FIG. 2A) substantially in the center. Carrier substrate 111 may be a frame-like structure supporting thermal interface layer 102. Thermal interface layer 102 may be bonded to carrier substrate 111 by an adhesive. TEC structures 104 are bonded to carrier substrate 111 by methods described above.

Figure 4B:
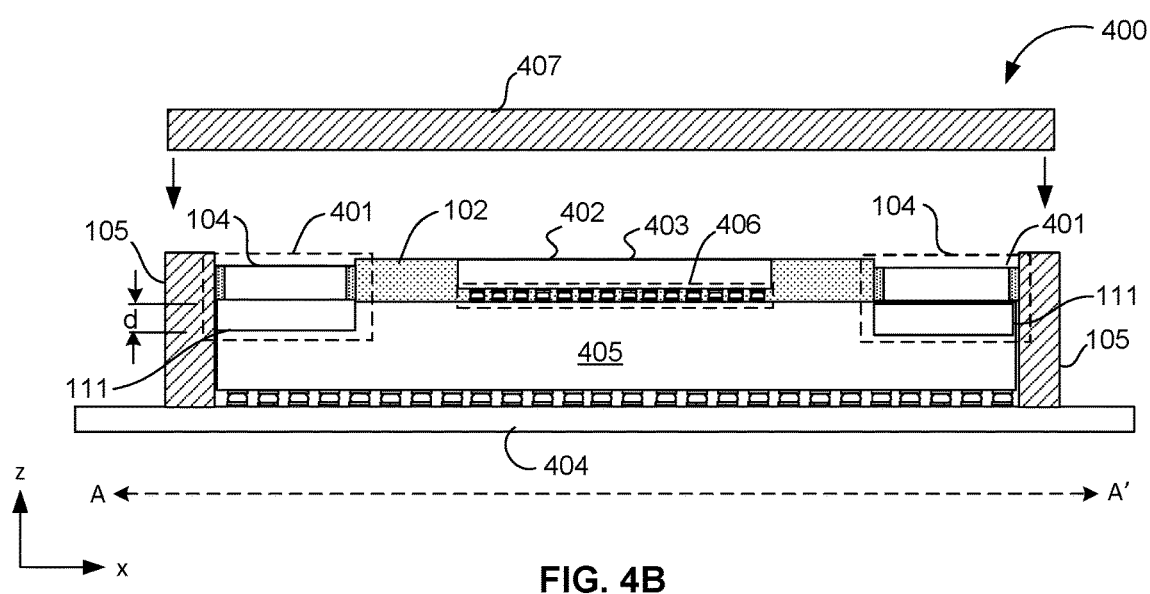
FIG. 4B illustrates a cross-sectional view in the x-z plane of an IC package, according to some embodiments of the disclosure.

IC die 402 may be electrically coupled to a package substrate below ATI subassembly 401 (not shown; see FIG. 4B). The package substrate may mechanically support ATI subassembly (e.g., as shown in FIGS. 1B and 4B). Electrical connections to IC die 402 and to TEC structures 104 may be made by metallization within the package substrate, including vias (e.g., vias 118) that provide vertical interconnects to interconnect traces 112 on carrier substrate 111, and to TEC structures 104 by solder bridges as described above. Vias coupled to interconnect traces 112 may extend vertically (in the z-direction) through package substrate material to PCB 404 to terminate at land-side interconnect pads or pins as shown for vias 118 in FIG. 1C.

FIG. 4B illustrates a cross-sectional view in the x-z plane (taken along cut A-A' in FIG. 4A) of IC package 400, according to some embodiments of the disclosure.

ATI sub-assembly 401 is over package substrate 405. The cross-section of carrier substrate 111 shows segments extending in the y-direction that frame thermal interface layer 102. Package substrate 405 comprises a dielectric that may be a molded epoxy compound or a build-up layer package substrate comprising dielectric laminates as described above. As shown by the illustrated embodiment, package substrate 405 has a recessed perimeter allowing carrier substrate 111 to seat. In some embodiments, the perimeter is recessed to a depth d that provides clearance for IC die 402 to attach to package substrate 405 by solder joints 406. The distance d may be substantially equal to the thickness of carrier substrate 111.

In the illustrated embodiment, IC die 402 is flush with thermal interface layer 102, where surface 403 is exposed. In some embodiments, IC die 402 is completely embedded in thermal interface layer 102, where surface 403 is below top surface of thermal interface layer 102. If completely embedded, a small layer of PCM over surface 403 of IC die 402 may function as a TIM layer that intervenes between IC die 402 and a thermal solution. In some embodiments, surface 403 is exposed, placing bare IC die 403 in direct contact with a thermal solution such as IHS lid 407 that may couple to thermal dissipation structures 105, or a heat sink (shown in FIG. 4C).

Figure 4C:
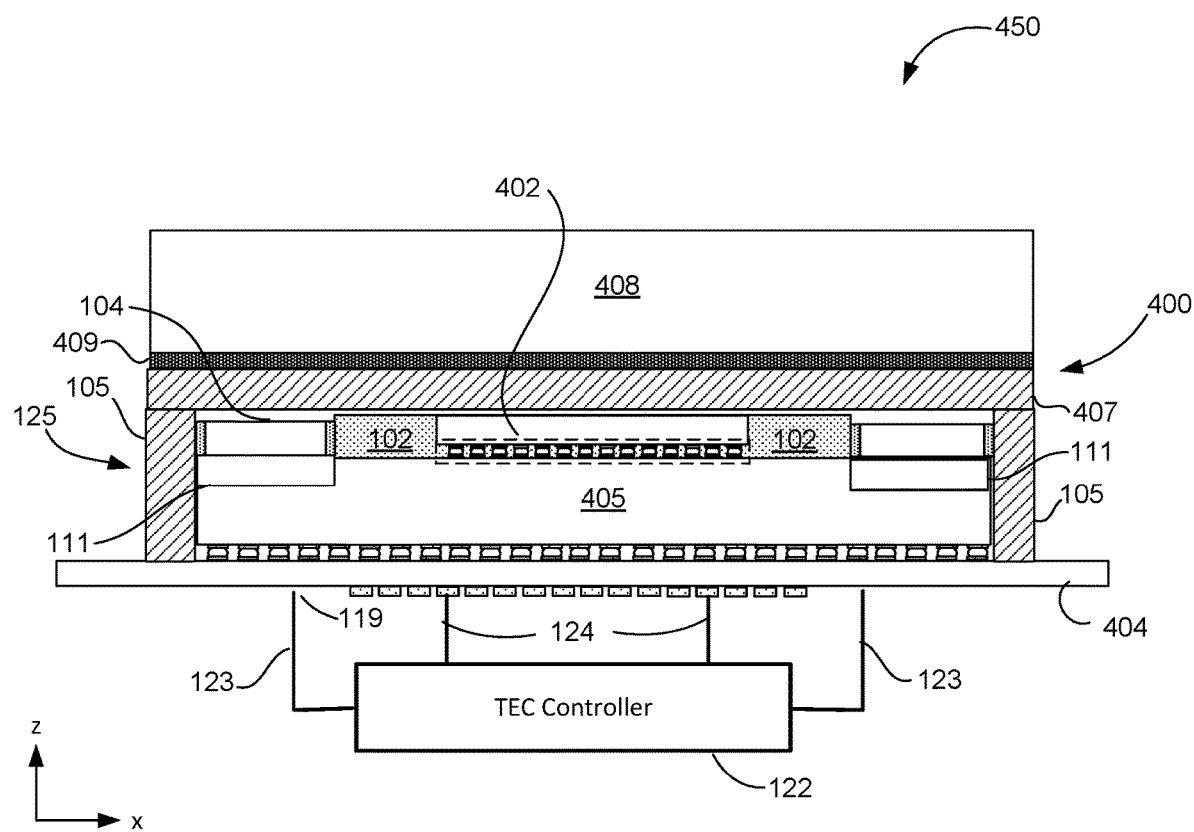
FIG. 4C illustrates a cross-sectional view in the x-z plane of a mounting assembly comprising an IC package assembly, according to some embodiments of the disclosure.

FIG. 4C illustrates a cross-sectional view in the x-z plane of mounting assembly 450 comprising IC package assembly 400, according to some embodiments of the disclosure.

FIG. 4C shows an exemplary implementation of IC package assembly 400, where IC package assembly 400 is incorporated in mounting assembly 450 as a package and thermal solution. In the illustrated implementation embodiment, a complete IHS structure comprises IHS lid 407 joined to IHS sidewalls 105. IHS lid 407 overlays bare IC die 402, where in some embodiments IHS lid 407 is in direct contact with IC die 402 and thermal interface layer 102. In some embodiments, a TIM layer (not shown) intervenes between IHS lid 407 and IC die 402 to enhance thermal coupling. In some embodiments, a gap is present between IHS lid 407 and IC die 402, minimizing direct thermal coupling through IHS lid 407. In some embodiments, IC die 402 protrudes above thermal interface layer 102, and IHS lid 407 is elevated above thermal interface layer 102 and not having direct thermal coupling to thermal interface layer 102.

TEC structures 104 abut IHS sidewalls 105 for disposal of rejected heat during operation of the device, as described above for IC package assembly 400. Heat rejected by TEC structures 104 may be transferred from IHS sidewalls 105 to the environment by radiation or convection. IHS sidewalls 105 may conduct a portion of the rejected heat to IHS lid 407, where it may flow to heat sink 408 overlaying IHS lid 407. Heat transfer to heat sink 408 may be enhanced by TIM layer 409, which may comprise materials such as, but not limited to, thermal grease, a thermal gel or a compliant thermal pad.

In the illustrated embodiment, TEC controller 122 supplies power to TEC structures 104 through power terminals 123. In a manner similar to the implementations described above for PoP assembly 300 and IC package assembly 100, power terminals 123 may be coupled to pads 119 through substrate 404, which may be a motherboard PCB. Vias (e.g., vias 118 in FIG. 1D; not shown) extending though dielectric 405 may couple to TEC structures 104 as described above.

Regulation of power by TEC controller 122 implements a control loop comprising temperature sensors (not shown). Temperature sensors may be integrated in IC die 402, or alternatively, temperature sensors may be disposed on IC package assembly 400 externally to IC die 402. In some embodiments, one or more temperature sensors may be within thermal interface layer 102. Temperature sensors may be coupled to terminals 124 on TEC controller 122. Details of thermal management of IC package assembly 400, employing thermoelectric cooling of thermal interface layer 102 are described below.

Figure 5A:
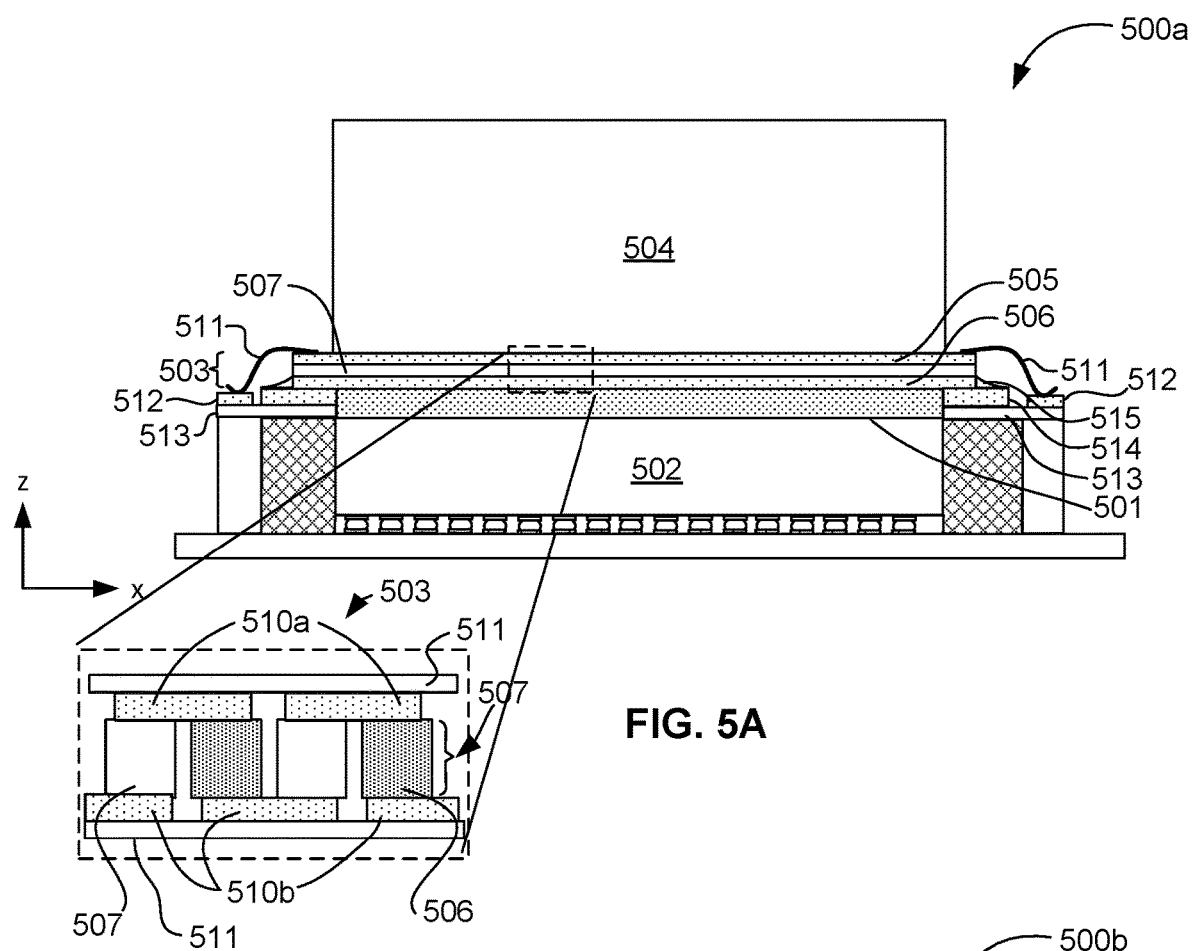
FIG. 5A illustrates a cross-sectional view in the x-z plane of an IC package assembly having an ATI subassembly comprising a planar TEC between a PCM and a thermal solution.

FIG. 5A illustrates a cross-sectional view in the x-z plane of IC package assembly 500a including ATI subassembly 501 comprising a planar TEC between a PCM and a thermal solution.

FIG. 5A shows IC package assembly 500a including ATI assembly 501 that comprises a vertical heat transfer path mediated by planar TEC 503 as a thermal interface material. Suitable PCM materials have been described above. TIM structure 501 is shown as an interface between IC die 502 and planar TEC 503. In some embodiments, planar TEC 503 has a thickness between 100 microns and 2 mm extending in the z-direction that is substantially smaller than lateral dimensions (e.g., width and length between 5 mm and 30 mm) in the x-y plane. In some embodiments, planar TEC 503 is interfaced with thermal solution 504, disposed over planar TEC 503. Thermal solution 504 may have a heat transfer surface extending in the x-y plane that interfaces with the superior surface (e.g., electrode 510a described below) of planar TEC 503.

Planar TEC 503 may be part of a subassembly, similar to subassembly 111 in FIGS. 1A-4B, where in some embodiments, TIM 501 is supported on or bonded to substrate 513. In some embodiments, substrate 513 has an aperture (not shown) whose perimeter frames TIM 501. In some embodiments, the aperture is rectangular. In some embodiments, the aperture is round. In some embodiments, substrate 513 is a printed circuit board having conductive metallization such as bond pads 512 and 514. In some embodiments, planar TEC 503 is bonded to carrier substrate 513 by non-conducting adhesives and conducting adhesives, and solder joints. In some embodiments, solder joints 515 may bond planar TEC 503 to substrate 513. In some embodiments, conductive adhesive bonds planar TEC 503 to substrate 513. Non-conductive adhesive may bond planar TEC 503 to dielectric portions of substrate 513.

Thermal solution 504 may be a heat sink or an IHS that is employed as a thermal mass that passively or actively dissipates heat pumped by planar TEC 503 from TIM structure 501 during operation of the device. TIM structure 501 comprises a PCM that absorbs heat from IC die 502 and extends the melting range of the PCM to maximize the heat capacity of the PCM during transients and extended periods of burst activity, according to some embodiments of the disclosure.

Planar TEC 503 comprises thermal junctions 505 and 506 disposed above and below, respectively, thermoelectric layer 507. In some embodiments, thermoelectric layer comprises p-type and n-type islands of thermoelectric material that extend in the z-direction between thermal junctions 505 and 506, and are electrically connected together in series (e.g., daisy-chained) along the x and y directions as thermoelectric pairs (adjacent p-type unit and n-type unit).

The inset in FIG. 5A shows details of an exemplary construction of planar TEC 503. In some embodiments, thermoelectric layer 507 comprises a two-dimensional array of thermoelectric islands 508 and 509, comprising semiconducting thermoelectric materials having opposing conductivity (e.g., p-type and n-type). Thermoelectric islands 508 and 509 extend in the z-direction between thermal junctions 505 and 506. Each adjacent pair of thermoelectric islands 508 and 509 is interconnected in a π (pi) topology by electrodes 510. Thermoelectric pairs comprising adjacent thermoelectric islands 508 and 509 coupled in series. In some embodiments, planar TEC 503 comprises dielectric sheaths 511 prevent electrodes 510 from contacting conducting surfaces and short-circuiting.

In some embodiments, electrical contacts are made to TEC 503 by a wire 511 bonded to a terminal electrode 510 (e.g., electrode 510a) on the topside of planar TEC 503 and to bond pad 512 on carrier substrate 513. In some embodiments, a terminal electrode (e.g., electrode 510b) on the bottom side of planar TEC 503 is bonded to pad 514 by solder joint 515 or by employment of conductive adhesive on the bottom electrode.

Figure 5B:
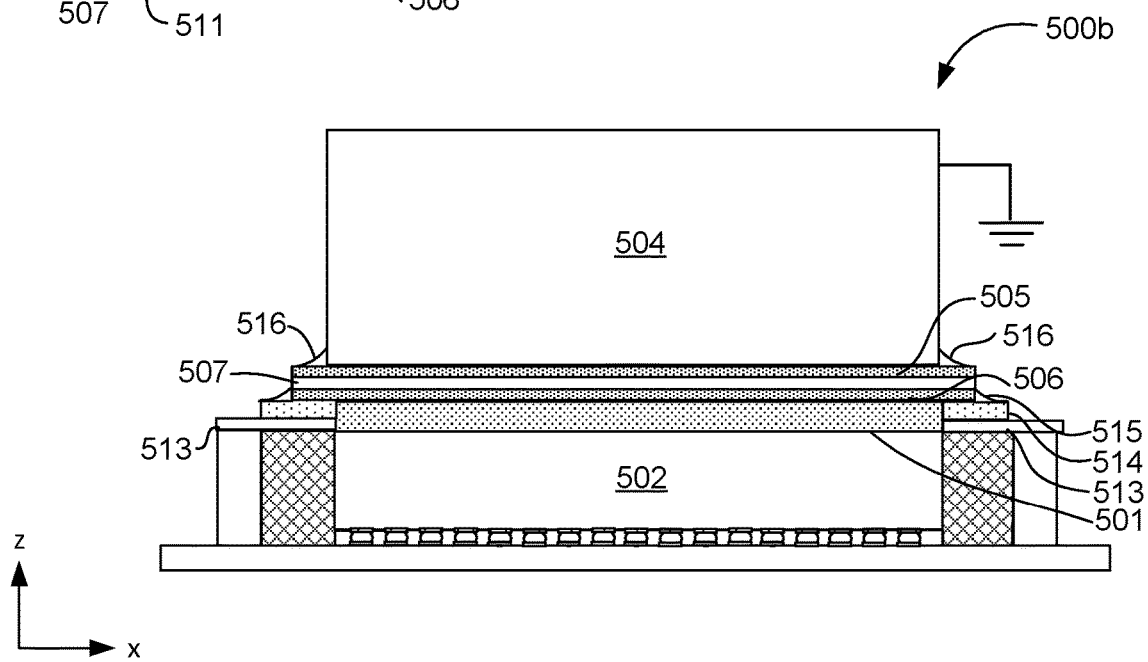
FIG. 5B illustrates a cross-sectional view in the x-z plane of an IC package assembly 500b having an ATI comprising a planar TEC, according to some embodiments fo the disclosure.

FIG. 5B illustrates a cross-sectional view in the x-z plane of IC package assembly 500b having ATI subassembly 501 comprising planar TEC 503, according to some embodiments of the disclosure.

FIG. 5B shows IC package assembly 500b including TIM structure 501 that comprises a PCM as a thermal interface material, forming a vertical heat transfer path mediated by planar TEC 503. Suitable PCM materials have been described above. In the illustrated embodiment, TIM structure 501 is an interface between IC die 502 and planar TEC 503. Exemplary dimensions are given above for planar TEC 503. As described for IC package assembly 500a, thermal solution 504 may be a heat sink or an IHS, and is disposed over planar TEC 503.

In the illustrated embodiment, thermal solution 504 is electrically grounded to connect planar TEC 503 to ground through solder joint 516 bridging a topside terminal electrode (e.g., electrode 510a) to thermal solution 504. Opposing thermoelectric junction 506 on the bottomside of planar TEC 503 may be coupled to a positive or a negative voltage rail through bond pad 514 on carrier substrate 513. Materials of construction for thermal solution 504 include, but are not limited to, copper, alloys of copper, aluminum and alloys of aluminum and steel alloys. As an example, a portion or the entirety of thermal solution 504 may be formed from copper. Copper is wettable by common solders, both leaded and lead-free, and enables formation of solid solder joints. Some silver-containing solders may be employed for soldering to steel surfaces. The grounded thermal solution configuration in the illustrated embodiment provides an alternative connection path to the wire-bonded connection through wire 511 in FIG. 5A.

Figure 6:
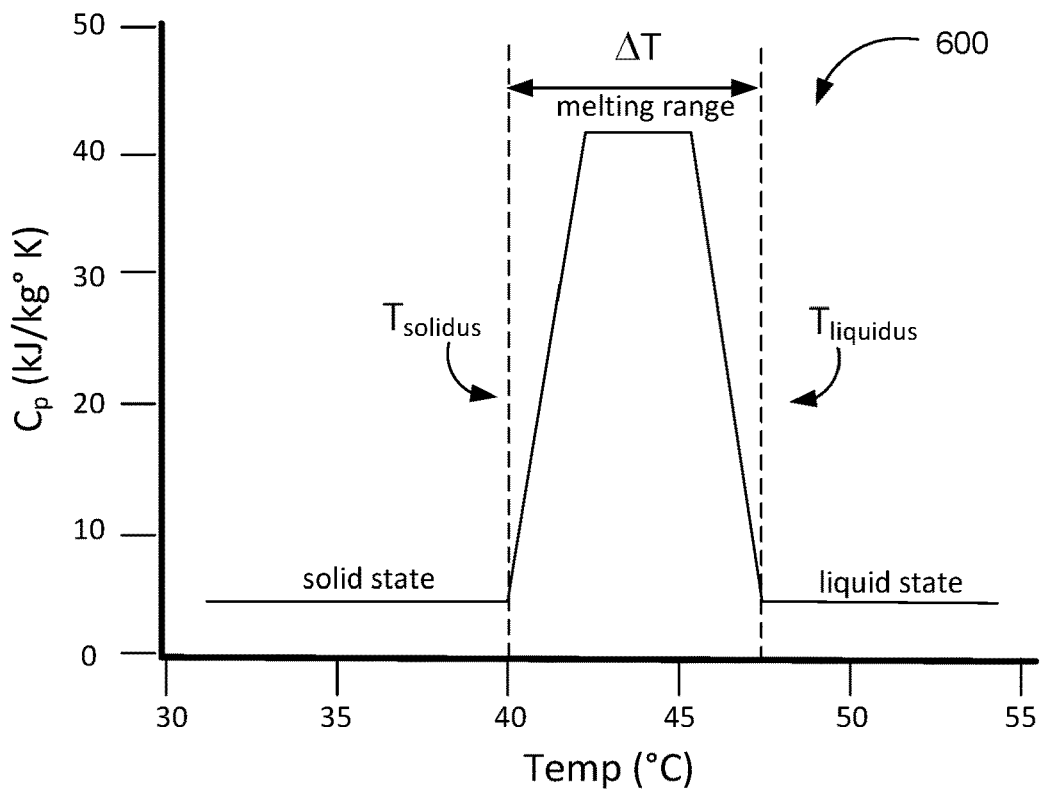
FIG. 6 illustrates a graph of heat capacity vs. temperature, showing a schematic heat capacity (Cp) curve of a PCM as a function of melting temperature range.

FIG. 6 illustrates graph 600 of heat capacity vs. temperature, showing exemplary heat capacity (Cp) curve 601 of a PCM as a function of melting temperature range.

Graph 600 displays an exemplary enthalpy derivative curve 601 plotted as heat capacity (Cp, kJ/kgC) as a function of temperature to show that during melting of PCM, to emphasize the heat absorption of the PCM is highest during the phase transition. The heat capacity rises rapidly at the solidus temperature ($T_{solidus}$) where melting begins and peaks to a value several times the heat capacities of the solid and liquid states as the temperature increases in the melting range. The area under the peak is substantially equivalent to the enthalpy (latent heat) of fusion of the PCM. The PCM may be a mixture of two or more components, where each pure component has a different melting point. The temperature range $\Delta T$ is related to the difference between melting points. The material is fully melted at the liquidus temperature $T_{liquidus}$. As $T_{liquidus}$ is approached, the heat capacity rapidly decreases to the liquid state value.

Cp rises rapidly to a peak between $T_{solidus}$ and $T_{liquidus}$, where the peak corresponds to an inflection point in the melting range in an enthalpy-temperature curve. The Cp curve then falls off approximately as rapidly to reach a substantially lower value as the PCM reaches $T_{liquidus}$. It will be understood that for a PCM comprising a single component (pure material), $\Delta T$ may be approximately zero during the phase transition. For a PCM comprising multiple components, $\Delta T$ is non-zero.

As the heat capacity Cp of the PCM peaks to a high value during melting, the PCM has the greatest ability to absorb heat emanating from an adjacent die during operation. If the heat output is excessive, as for example, during a burst of activity in "turbo" mode for a graphics processor executing instructions for complex animation of a video display, the heat transfer mediated by the PCM is most rapid if the heat capacity of the PCM is at its peak for the full duration of the burst period.

The duration of PCM melting is a function of the net heat flow into the PCM. Higher net heat flow results in a shorter melting duration. The net heat flow is the difference between heat flow in and heat flow out of the PCM. In practice, heat removal rate from the PCM in the absence of thermoelectric cooling may be controlled only by passive heat transfer from the PCM mass, if the PCM is in contact with other materials having relatively high heat conductivity. When thermoelectric cooling is active, the overall heat removal rate from the PCM is increased, reducing the net heat flow. This action prolongs the duration of melting.

Figure 7:
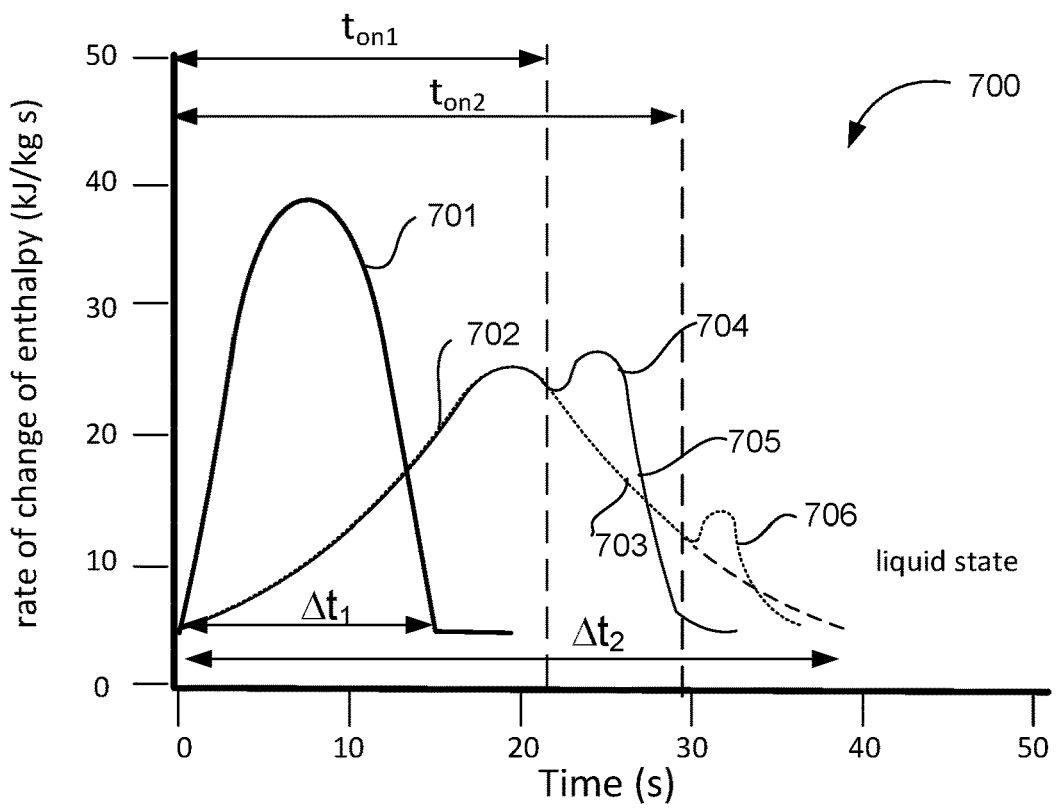
FIG. 7 illustrates a graph of rate of heat storage vs. time in a phase-change material (PCM), showing a schematic relationship between the power-on duration for TEC structures and extension of the melting duration of a PCM.

FIG. 7 illustrates a graph 700 of PCM heat storage vs. time, showing a schematic relationship between the power-on duration for TEC structures 104 and extension of the melting duration of a PCM in thermal interface layer 102.

Curves 701, 702 and 703 represent the rate of enthalpy accumulation in a PCM as a function of time, where curve 701 represents the rate of enthalpy accumulation if the PCM when no power is applied to the TECs. Curves 702 and 703 represent the rate of enthalpy accumulation in the PCM when the TECs are powered on for two different durations, $\Delta t_{on1}$ and $\Delta t_{on2}$, where $\Delta t_{on2}$ is greater than $\Delta t_{on1}$. As an example, the PCM is in thermal interface layer 102 in IC package assembly 150 as shown in FIG. 1D, during operation of the device. In IC package assembly 150, thermal interface layer 102 is interfaced below with IC die 114, TEC structures 104 on two sides, and IHS lid 117 above. IC die 114 may be a microprocessor.

In the illustrated example, heat input from the IC die or package (e.g., IC die 114) to the PCM may be approximately constant during a period of burst activity. TEC structures 104 may be activated as a temperature sensor within IC die 114 senses that the temperature of the PCM within thermal interface layer 102 is approaching $T_{solidus}$. When powered on, TEC structures 104 actively extract heat from the PCM. In some embodiments, the rate of removal of heat by the TECs is substantially constant. In some embodiments, the power delivered to TEC structures 104 may be automatically varied to meet a specified heat removal demand.

A steady state net heat flow may be established, where the difference between the heat extraction rate and the rate of heat input from the IC die(s) is approximately constant. The resultant net heat flow may be accumulated in the PCM as enthalpy (e.g., stored latent heat) during the melting phase. In graph 700, the time scale is proportional to the temperature rise of the PCM within its melting range. The time span $\Delta t_1$ for curve 701 is the melting duration for the case when TECs are off (inactive). The rate of enthalpy change traced by curve 701 follows the change of heat capacity Cp(T) within the melting range, as shown in FIG. 6. The area under curve 701 is approximately equivalent to the latent heat of fusion of the PCM.

During the melting phase, the enthalpy of the PCM rises to a peak value that is many times larger than Cp in the solid state (e.g., at temperatures lower than $T_{solidus}$). Thus, the heat input into the PCM may not cause an appreciable temperature rise of thermal interface layer 102 as long as the PCM is melting. With a slowly rising PCM temperature, heat flux into the PCM may be approximately constant during the melting phase.

The time interval $\Delta t_1$ spanned by curve 701 is the melting duration for purely passive heat transfer into and out of thermal interface layer 102, when TEC structures 104 are inactive. When TEC structures 104 are powered on, heat may be pumped out of thermal interface layer 102 actively at a rate that is partially determined by the electrical power input to TEC structures 104, and partially determined by the rate of lateral heat conduction through the PCM from the interior of thermal interface layer 102 to thermal junctions of TEC structures 104 at sidewalls 115. As a consequence of the geometry of the thermal interface layer 102 shown in FIG. 1D, the heat transfer path may be up to 20 mm long. Curves 702 and 703 show the effect of rate of enthalpy accumulation The cycle time for TECs may be related to the burst activity by the IC die, where it may be generating excessive heat. A smart controller (e.g., TEC controller 122) may continue to supply power to the TECs as long as the burst activity continues. As heat flowing into the thermal interface layer is partially removed by the TECs, the melting duration is extended due to a slower net rate of rate of heat storage in the PCM. For curve 702 has a broader and flatter profile than curve 701, reflecting the slower rate of heat storage when TEC structures 104 are powered on for a period of $\Delta t_{on1}$.

Curve 702 is substantially broadened in comparison to curve 701, indicating a prolonged melting duration $\Delta t_2 > \Delta t_1$. This is due to the heat pumping action of the activated TECs, indicating a longer melting duration of the PCM. The extended melting duration $\Delta t_2$ is the melting duration when the TECs are powered on for the full melting duration, until the temperature of the PCM reaches $T_{liquidus}$. Here, $\Delta t_{on1}$ is equal to or greater than $\Delta t_2$. As the rate of heat removal by the TECs is proportional to the electrical power input, the rising and descending slopes of curve 702 are proportional to the power input to the TECs.

Secondary peak 704 may appear if $\Delta t_{on1}$ is less than $\Delta t_2$, the full melting duration of the PCM, where the TECs are turned off before the PCM has completed melting. As heat from the IC die is still flowing into the PCM, secondary peak 704 indicates resumption of the faster rate of heat storage in the PCM when TECs are off. The rising slope of secondary peak 704 approaches the value of the rising slope of curve 701, and flattens as the melting phase completes. Descending slope 705 of secondary peak 704 approaches the value of the descending slope of curve 701 as the rate of heat storage plummets because the PCM has reached liquidus (e.g., temperature of the PCM is equal to or greater than $T_{liquidus}$) and heat capacity Cp of the PCM takes on the value for the liquid state. Curve 702 has a shorter duration than $\Delta t_2$ because $t_{on1}$ is less than $\Delta t_2$. However, the area under curve 702, including secondary peak 704, is substantially equivalent to the latent heat of fusion of the PCM.

Curve 703 is representative of a longer power-on period for the TECs. Here, the TECs are powered on for $t_{on2} > t_{on1}$. In the illustrated embodiment, electric power input to the TECs is the same for both curves 702 and 703, so the rising slopes of the two curves are the same. If the power level to the TECs are different, then the different power inputs are reflected by different rising slopes of the curves. As $t_{on2}$ is closer to $\Delta t_2$, the TECs are powered off as melting is almost complete. Secondary peak 706 arises for the same reasons as secondary peak 704, but to a lesser extent as the rate of heat accumulation is naturally slower because the TECs are shut off when most of the latent heat of fusion is already accumulated (e.g., Cp is smaller, see FIG. 6). Extending $t_{on2}$ beyond $\Delta t_2$ so the TECs are active for the full melting period, the PCM may store the maximal amount of heat for a given duration.

The melting duration of the PCM may be extended by adjusting the amount of power to the TECs. To an extent determined by heat transfer rate within the PCM layer, higher amounts of TEC power may further flatten curves 702 and 703, effectively extending the PCM melting duration. As an example, the cross section of thermal interface layer 102 in FIG. 1D has a low thickness-to-width aspect ratio, which may present a relatively high thermal resistivity that may necessitate a lower limit for thermal conductivity of the PCM to ensure adequate heat transfer to TEC structures 104. If the pumping power of the TECs exceeds the heat transfer rate of the PCM layer (e.g., thermal interface layer 102), the rate of heat extracted is limited by the heat conduction rate through the PCM layer, which is determined by the thermal conductivity of the PCM and the temperature differences between different points in the interior and the edges of the PCM layer.

As an example, referring to FIG. 1D, for a heat transfer rate of 10 W into TEC structures 104, a thermal interface layer 102 having a thickness in the z-direction of 1 mm and a maximum lateral heat transfer path length of 10 mm (e.g., from the middle to each edge of a thermal interface layer 102 having a width in the x direction of 20 mm. a suitable thermal conductivity value for thermal interface layer 102 may be between 20 and 100 W/mK, taking into account shorter lateral heat transfer paths closer to the TEC structures 104.

Figure 8:
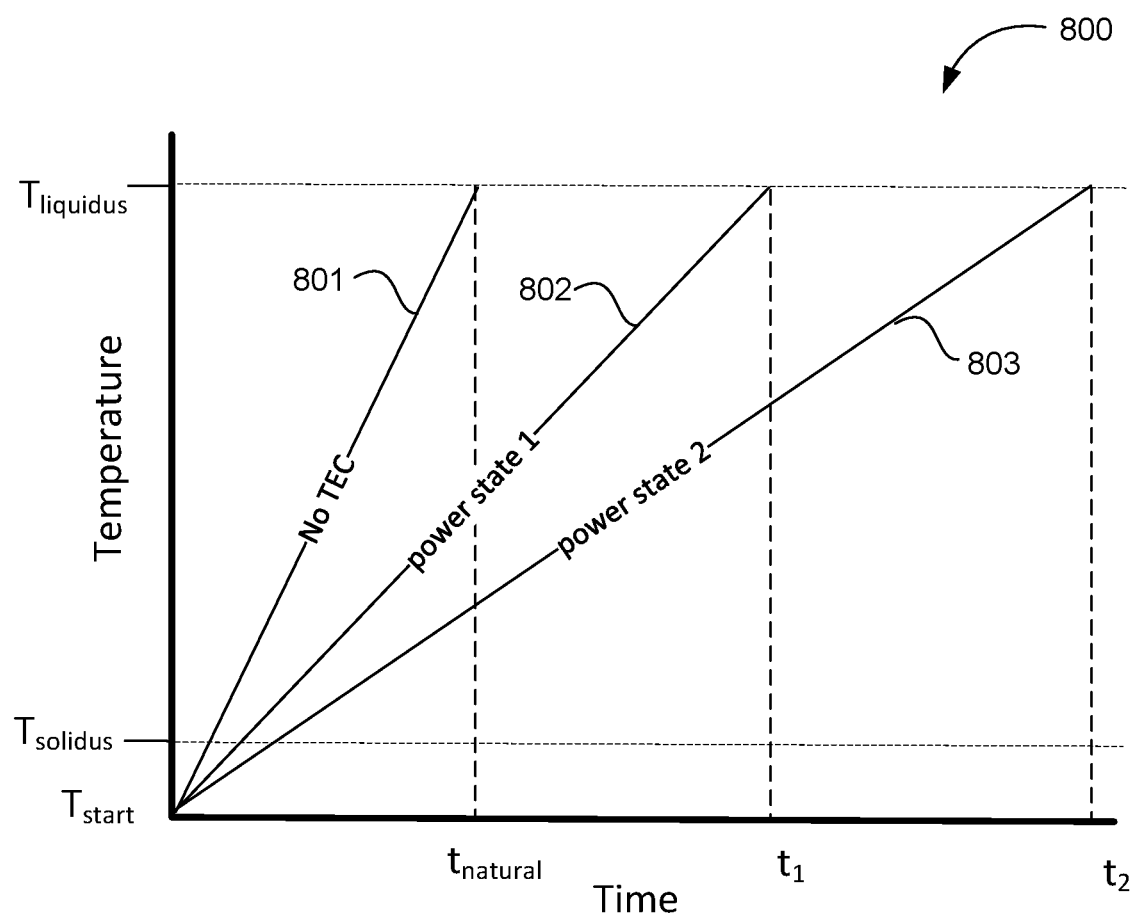
FIG. 8 illustrates a graph showing the temperature rise as a function of time in an active thermal interface comprising a PCM with and without active thermoelectric cooling, according to some embodiments of the disclosure.

FIG. 8 illustrates graph 800 showing the temperature rise as a function of time in an active thermal interface comprising a PCM with and without active thermoelectric cooling, according to some embodiments of the disclosure.

Graph 800 is a plot of PCM temperature as a function of time, showing how TEC incorporation in a thermal interface layer (e.g., ATI 101 in FIG. 1D) may extend melting of the PCM layer by delaying attainment of $T_{liquidus}$. Curves 801, 802 and 803 are representative of a thermal interface (e.g., ATI 101) with TECs (e.g., TEC structures 104) inactive (curve 801) and with different levels of electric power, power state 1 (curve 802) and power state 2 (curve 803), delivered to the TECs. Curve 801 is representative of PCM temperature rise with no active thermoelectric cooling. $T_{liquidus}$ is reached in a time $t_{natural}$, which may be characteristic for purely passive heat transfer into and out of the PCM layer.

Curves 802 and 803 are representative of PCM temperature rise with active thermoelectric cooling. Curves 802 and 803 show attainment of $T_{liquidus}$ in a time $t_1 > t_{natural}$ or $t_2 > t_{natural}$, respectively, where the power delivered to the TECs in power state 1 is lower than the power delivered to the TECS in power state 2 (e.g., power state 2>power state 1) as reflected by $t_2 > t_1$. This is reflected by the larger slope of curve 802 than for curve 803, permitting curve 802 to reach $T_{liquidus}$ in a shorter time (e.g., t1) than the time necessary (e.g., t2) for curve 803 to reach $T_{liquidus}$. As explained above, more heat is removed from the PCM layer in power state 2, where more heat may be pumped by the TECs. This higher rate of heat removal may cause slower heat accumulation in the PCM layer. By this mechanism, attainment of $T_{liquidus}$ is delayed, occurring in a melting duration time t1 or t2, which may be substantially longer than time $t_{natural}$, where no active thermoelectric cooling is taking place.

Extension of the melting phase may be regulated by changing the power level to the TECs. If excessive heat generation by an IC die or package interfaced with the PCM layer is caused by burst activity of the IC die, then a sudden temperature rise in the IC die may be detected by on-board temperature sensors. This may trigger a TEC controller to power on the TECs. The TECs may be powered on before the temperature of the IC die reaches $T_{solidus}$, or the start of melting. Parameters such as the electric power delivered to the TECs and the on time $t_{on}$ may also be set or varied as the burst activity of the IC die continues, intensifies or reduces.

The effectiveness of the ATI may be measured in terms of extension of burst activity time of a CPU as a function of the coefficient of performance (COP) of a TEC structures (e.g., TEC structures 104) included in the ATI. The COP is defined as the ratio of the heat extraction rate in watts and the input power to the TEC, and normalizes the power levels for the purposes of comparison across devices. COP is a measure of TEC efficiency. As an example, for a particular set of parameters (e.g., $T_{melting}$=55 C, k=5 W/mK, thickness-100 microns, density=0.85 g/cm$^3$), the burst time for a CPU may be increased from 91 seconds to 122 seconds for a COP of 1.1, and to 153 seconds for a COP of 2.5. The prolonged burst times are approximately equal to the melting duration of the PCM.

FIGS. 9A-9H illustrate cross-sectional views in the x-z plane of the evolution of IC package assembly 100 during an exemplary manufacture process, according to some embodiments of the disclosure.

Figure 9A:
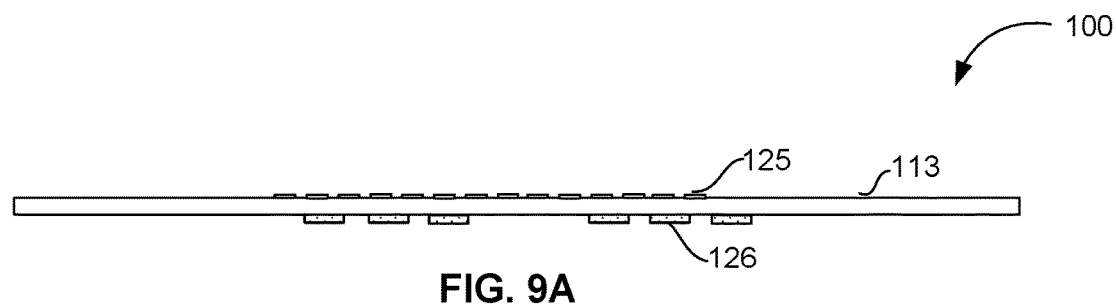
FIGS. 9A-9H illustrate cross-sectional views in the x-z plane of the evolution of an IC package assembly during an exemplary manufacture process, according to some embodiments of the disclosure.

At the operation shown in FIG. 9A, base substrate 113 is received. In some embodiments, base substrate 113 comprises a PCB material. In some embodiments, package substrate may comprise a ceramic material, including a ceramic composite. Base substrate 113 may comprise die-side pads 125 and land-side interconnects 126, as shown in the illustrated embodiment. In some embodiments, land-side interconnects 126 are a ball grid array that is solder bonded to a PCB motherboard. In some embodiments, land-side interconnects 126 are in a pin array for attaching to a socket on a motherboard.

Figure 9B:
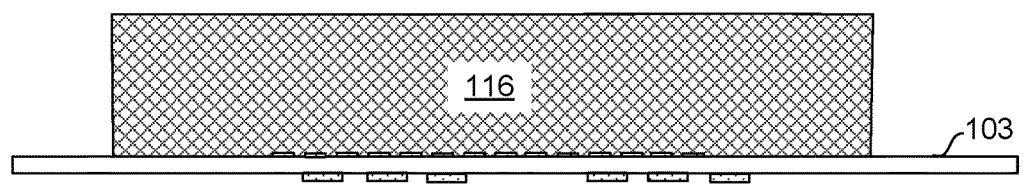

At the operation shown in FIG. 9B, dielectric 116 is formed over base substrate 113. In some embodiments, dielectric 116 is formed by a build-up process, where dielectric 113 comprises a stack of laminated sheets of dielectric material. An example of such a package may be formed in a bumpless build-up layer (BBUL) package fabrication process.

The laminates may also carry thin copper foils that can be patterned into traces and pads, adding multiple layers of embedded metallization. In some embodiments, dielectric 116 is a molded organic resin, resin/ceramic composite, or a pure ceramic. Generally, molded dielectric packages are assembled by attaching IC die(s) (e.g., IC die 114) to base substrate 113, with subsequent formation of a molded encapsulation embedding the IC die(s). Such packages may have only a two layers of metallization, such as die-side pads 125 and land-side pads 126.

Figure 9C:
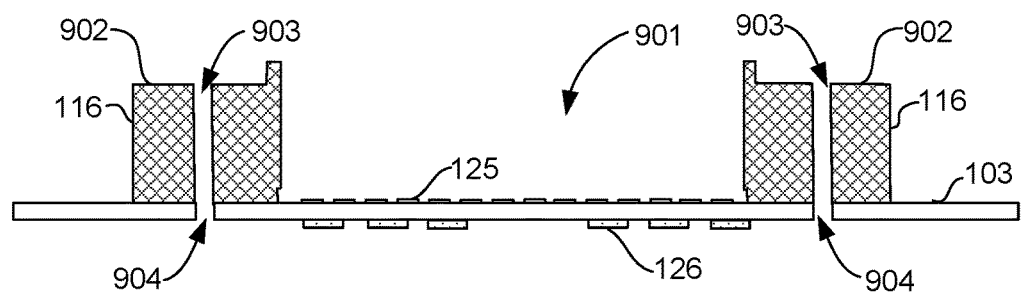

In the operation shown in FIG. 9C, cavity 901 is formed. In some embodiments, cavity 901 is made by a laser drilling process. In some embodiments, cavity 901 is formed lithographically by a dry etching process, such as deep reactive ion etching (DRIE). In some embodiments, cavity 901 is formed lithographically by a wet etch process. Pads 125 may be exposed by formation of cavity 901. Pads 125 may receive an IC die (e.g., IC die 114) in a subsequent operation.

Recesses 902 may be formed either before or after formation of cavity 901. A lithographic DRIE process or wet etch process may be employed to form recesses 902. In some embodiments, recesses 902 may be formed by a laser machining process, such as laser ablation (drilling, milling). Recesses 902 may be formed to a suitable depth to receive the carrier substrate (e.g., carrier substrate 111) of an ATI subassembly (e.g., ATI subassembly 101).

Via openings 903 are formed in the region of recesses 902. Via openings 903 may be laser drilled, and may extend completely through dielectric 116 to base substrate 113. Separate via 904 may be made in base substrate 113 to allow vias (e.g., vias 118) formed in a subsequent operation to extend through to the land side of base substrate 113. In some embodiments, vias openings 903 are formed before cavity 901.

Figure 9D:
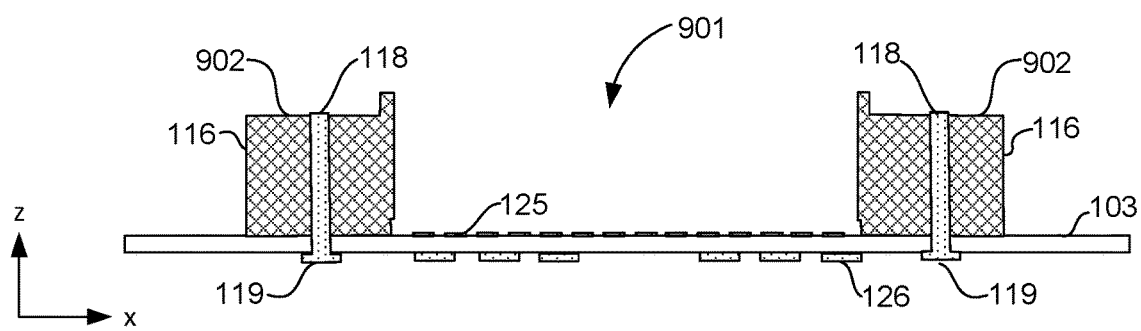

In the operation shown in FIG. 9D, vias 118 are formed within via openings 903 by an electroplating process. In some embodiments, a seed layer is formed on sidewalls of via openings 903 and 904 as an electrified plating surface. Formation of vias 118 may extend through base substrate 113 to form pads 119. Within recess 902, a pad may be formed at the top of vias 118 by lateral overgrowth of the plating material (e.g., copper). In some embodiments, vias 118 may be plated simultaneously with pads 126 and pads 125 within cavity 901.

Figure 9E:
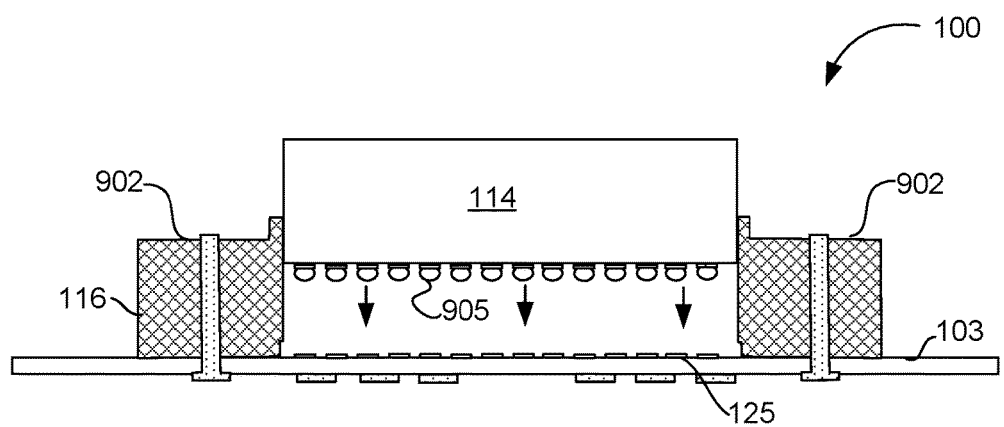

In the operation shown in FIG. 9E, IC die 114 is attached to base substrate 113 through cavity 901. In some embodiments, IC die 114 is attached by a flip-chip process. IC die 114 by solder-bonding solder balls 905 to pads 125 by a reflow process. An underfill material may be introduced (e.g., a capillary underfill) to cement IC die 114 to base substrate 113. In some embodiments, IC die 114 is flip-chip bonded to base substrate 113 before dielectric 116 is formed by molding over IC die 114.

Figure 9F:
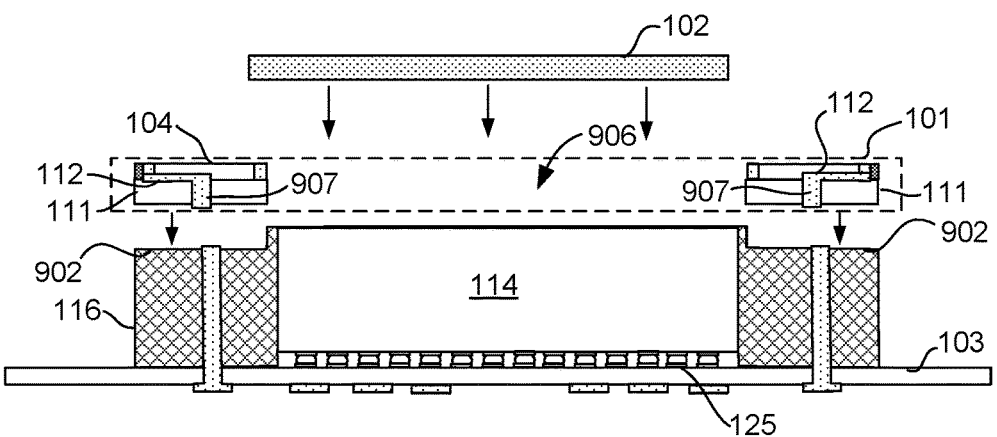

In the operation shown in FIG. 9F, ATI subassembly 101 is assembled into IC package assembly 100. ATI subassembly 101 may be pre-fabricated in a separate assembly process (e.g., ATI subassembly 200 in FIG. 2B). In some embodiments, TEC structures 104 may be formed as thick films (films with a thickness greater than 1 micron) by sputtering methods, such as RF sputtering of some thermoelectric materials. The thermoelectric material may be patterned by use of lithographically-defined masks, where a n-type material is deposited through a first shadow mask (e.g., to define TEC segments 106) using a first sputtering target, and a p-type material is deposited through a second shadow mask (e.g., to define TEC segments 107) using a second sputtering target. Doping may be by use of two separate targets respectively having n-doped and p-doped thermoelectric materials. In alternative embodiments, doping may be by ion implantation. The materials may be polycrystalline as deposited.

In some embodiments, TEC structures 104 are formed as thick films by through-mask electrodeposition techniques. In a method similar to sputtering, two lithographically-defined masks may be employed for one plating bath for plating the matrix material to be doped by ion implantation or diffusion, or two separate plating baths, one for plating the p-type material and the second for plating the n-type material, where the conductivity is determined by bath composition. The materials may be polycrystalline as deposited.

In some embodiments, TEC structures 104 are formed as thick films by chemical vapor deposition through a set of lithographically-defined masks. Doping may be by compositional variations or by ion implantation and diffusion. The materials may be amorphous, polycrystalline or monocrystalline as deposited.

In some embodiments, TEC structures 104 are formed as thick films by liquid phase deposition through a set of lithographically defined masks. Doping may be by compositional variations or by ion implantation and diffusion. The materials may be amorphous, polycrystalline or monocrystalline as deposited.

In some embodiments, thermal interface layer 102 may be assembled after installation of ATI subassembly 101. Thermal interface layer 102 is shown as a separate component that may be fit into aperture 906 in carrier substrate 111. Thermal interface layer 102 may be incorporated into ATI subassembly 101 in a separate assembly line, or in-line with the assembly of IC package 100, as shown in the illustrated embodiment. Thermal interface layer 101 may be cut from a sheet of solid PCM. Materials have been described above that would be suitable for thermal interface layer 101. An example of suitable PCM is a polyethylene polymer matrix or a wax that can be formed as sheets. The sheets may be cut to fit aperture 906, and transferred to ATI subassembly 101. Cut-outs of PCM sheet forming thermal interface layer 102 may be positioned so that TEC structures 104 abut the edges of the sheets. The PCM cut-out may be adhered to the perimeter of aperture 906 with an adhesive (e.g., bonding agent 110), on framing portions of carrier substrate 111. Thermal interface layer 102 may be directly contacted to IC die 114

Carrier substrate 111 may be fitted into recesses 901 at the top of dielectric 116 by a pick and place operation during this stage of assembly of IC package assembly 100. The operation may fit thermal interface layer 102 onto IC die 114. Carrier substrate 111 supports TEC structures 104, and traces 112, which may be directly fabricated on carrier substrate 111 by thin-film techniques. Traces 112 extend over carrier substrate 111 and vias 907 extend through carrier substrate 111, and may be formed by electrodeposition of copper or other suitable metals.

Figure 9G:
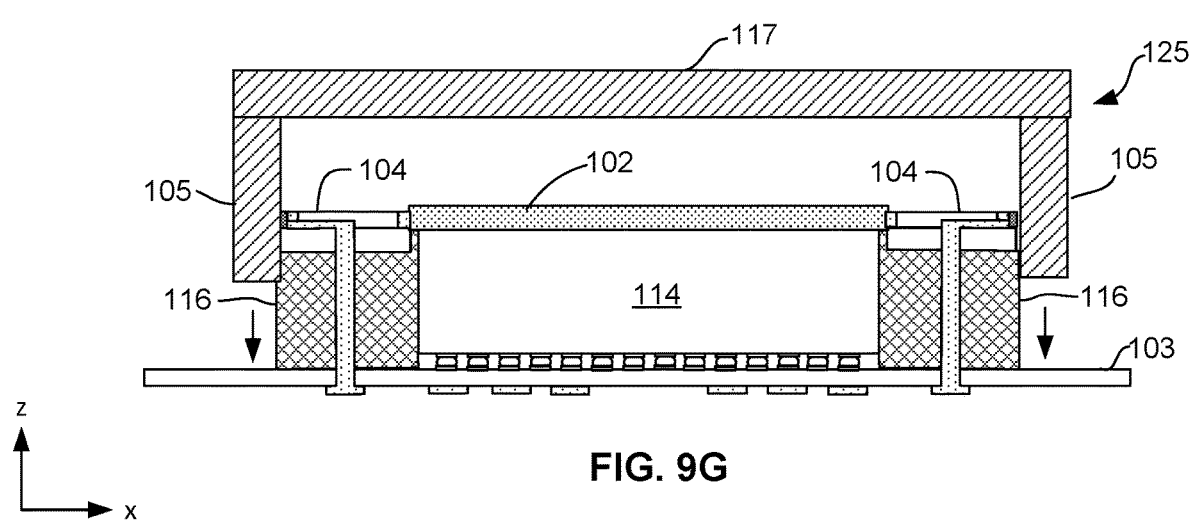

In the operation shown in FIG. 9G, IHS 125 is assembled onto IC package assembly 100. IHS 125 may be press-fitted over ATI subassembly and dielectric 116 such that IHS Lid 117 is directly contacted to thermal interface layer 102, and TEC structures 104 abut IHS sidewalls 105. In some embodiments, IHS sidewalls 105 are anchored to base substrate 113 by an adhesive layer.

Figure 9H:
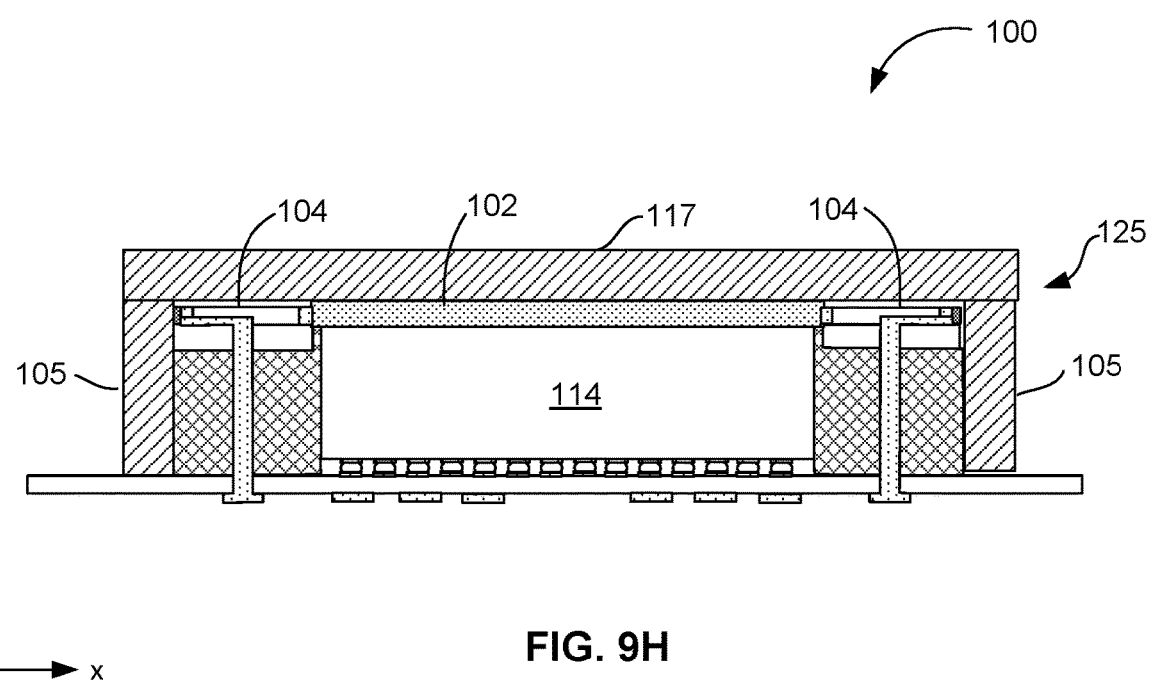

In the operation shown in FIG. 9H, IC package assembly 100 is complete to the stage of assembly shown in the illustrated embodiment. IHS 125 may be further embedded in an over mold material (not shown), with the top of IHS lid 117 exposed by a planarization operation (e.g., chemical mechanical polishing) to interface with a thermal solution (e.g., heat sink 120 in FIG. 1D). IHS lid 117 may conduct heat absorbed by IHS sidewalls 105 from TEC structures 104, and heat passively transferred from thermal interface layer 102 to a thermal solution (e.g., heat sink 120 in FIG. 1D) in an implementation (e.g., IC mounting assembly 150 in FIG. 1D.

Figure 10:
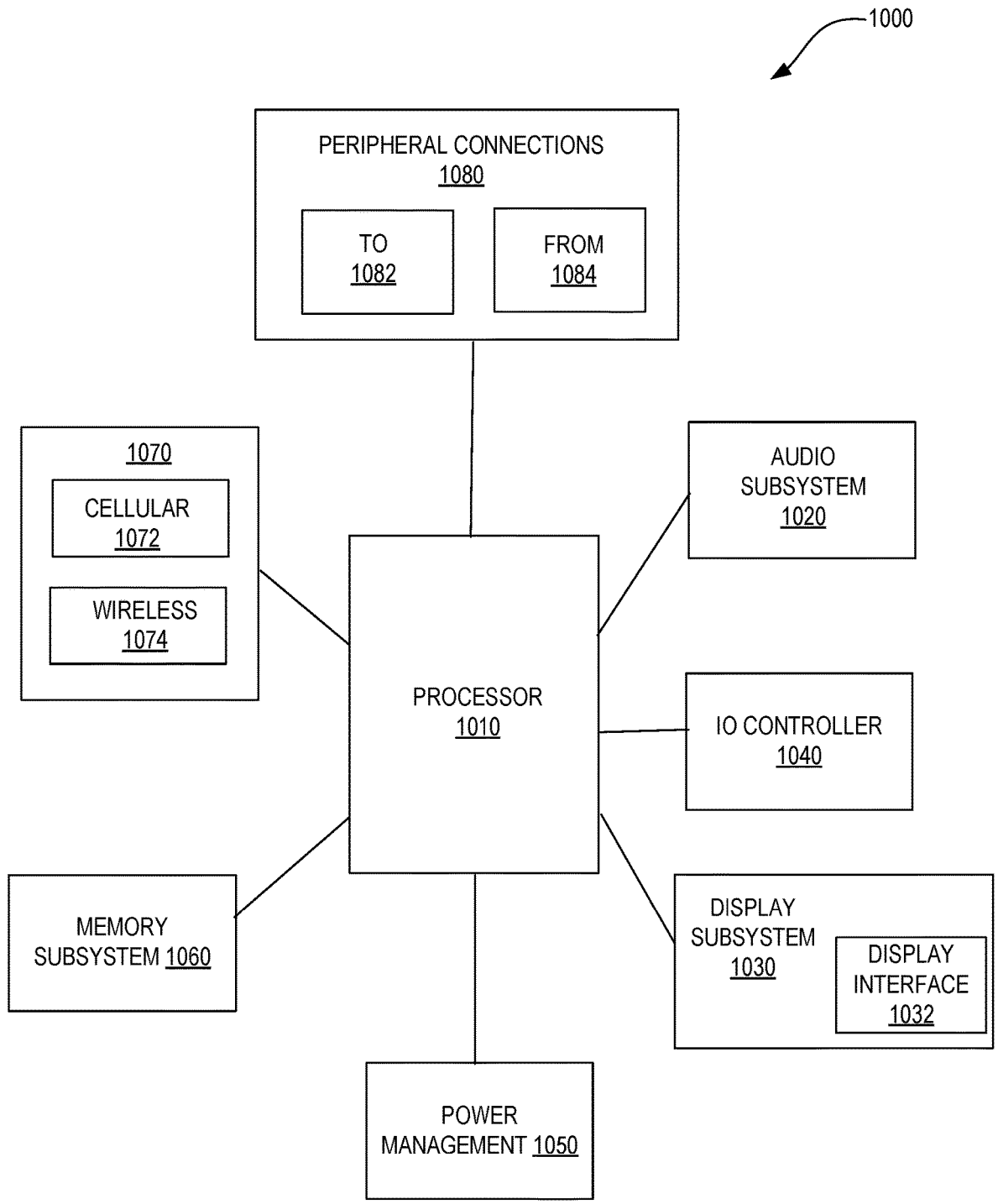
FIG. 10 illustrates a block diagram of a computing device comprising an IC package including an active thermal interface (ATI) as part of a system-on-chip (SoC) package in an implementation of a computing device, according to some embodiments of the disclosure.

FIG. 10 illustrates a block diagram of computing device 1000 comprising IC package 100 including active thermal interface (ATI) 101 as part of a system-on-chip (SoC) package (e.g., any of IC assemblies 100, 200, 300 or 400) in an implementation of a computing device, according to some embodiments of the disclosure.

According to some embodiments, computing device 1000 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 1010 representing a central processing unit (CPU) or a graphical processing unit (GPU)), comprising one or more dies, is mounted on a motherboard of computing device 1000. The IC package may comprise vertically integrated multiple dies or stacked individual packages in a package-on-package (PoP) architecture. In all architectures, IC packages may dissipate a large amount of heat during burst activity periods, when large computing demands are placed on the CPU or GPU. Large power dissipation results in excess heat, necessitating an enhanced thermal solution. According to some embodiments, computing device 1000 employs an IC package (e.g., package 100) having an active thermal interface (e.g., ATI 101) mounted between the IC package and a thermal solution, where the ATI comprises a thermal interface layer phase change material (PCM). Thermoelectric cooling structures (e.g., TEC structures 104) are activated during burst activity periods of the CPU or GPU, removing heat from the PCM during the phase transition, which may be a melting of a solid PCM to the liquid state. During the phase change of the PCM, the heat capacity of the PCM may increase by at least an order of magnitude, permitting a great amount of the latent heat of fusion to be stored in a thin layer of material with a very small change in temperature of the material.

In some embodiments, computing device has wireless connectivity (e.g., Bluetooth and/or WiFi). It will be understood that certain components are shown generally, and not all components of such a device are shown in computing device 1000.

The various embodiments of the present disclosure may also comprise a network interface within 1070 such as a wireless interface so that a system embodiment may be incorporated into a wireless device, for example, cell phone or personal digital assistant.

According to some embodiments, processor 1010 represents a CPU or a GPU, and can include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010.

Display subsystem 1030 represents hardware (e.g., display devices) and software (e.g., drivers) components that provide a visual and/or tactile display for a user to interact with the computing device 1000. Display subsystem 1030 includes display interface 1032 which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Network interface 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
an integrated circuit (IC) package coupled to a substrate;
a thermal interface layer comprising a phase change material (PCM) over the IC package; and
at least one thermoelectric cooling (TEC) apparatus thermally coupled to the thermal interface layer, wherein the at least one TEC apparatus comprises a first surface over an opposing second surface, wherein the first surface comprises a first thermoelectric junction and the second surface comprises a second thermoelectric junction, and wherein the second thermoelectric junction is adjacent to the thermal interface layer, and the first thermoelectric junction is adjacent to an integrated heat spreader or a heat sink.

2. The apparatus of claim 1, wherein the thermal interface layer comprises any one of nonadecane, decanoic acid, eicosane, dodecanoic acid, docosane, stearic acid, tetradecanoic acid, octadecanol, hexadecanoic acid, paraffins, bismuth, lead, tin, cadmium, antimony, indium, thallium, tellurium, selenium, or gallium.

3. The apparatus of claim 1, wherein a thermoelectric material of the TEC apparatus comprises any one of bismuth, antimony, lead, phosphorous, arsenic, silicon, germanium, strontium, titanium, oxygen, cobalt, niobium, hafnium, zirconium, selenium, tellurium, iron, nickel, gold, copper, indium, tin, gold, vanadium, manganese, zinc or rare earth elements.

4. The apparatus of claim 1, wherein multiple regions of the TEC apparatus comprise a first array of islands that comprise a n-type thermoelectric material, wherein the first array of islands extend in a first direction and a second direction, and interpenetrates a second array of islands such that islands of the first array alternate with islands of the second array, wherein the second array of islands extends in the first direction and the second direction, and wherein the second array of islands comprise a p-type thermoelectric material.

5. The apparatus of claim 1, further comprising at least one temperature sensor coupled to the thermal interface layer.

6. The apparatus of claim 1, further comprising:
a controller electrically coupled to the at least one TEC apparatus; and
a power source coupled to the IC package.

7. An apparatus, comprising:
an integrated circuit (IC) package coupled to a substrate;
a thermal interface layer comprising a phase change material (PCM) over the IC package;
at least one thermoelectric cooling (TEC) apparatus thermally coupled to the thermal interface layer;
at least one temperature sensor coupled to the thermal interface layer; and
a controller coupled to the least one temperature sensor and to the at least one TEC apparatus.

8. The apparatus of claim 7, wherein the thermal interface layer has a first surface over and thermally coupled to the IC package and an opposing second surface over the first surface and thermally coupled to a heat sink or an integrated heat spreader.

9. The apparatus of claim 7, wherein the IC package is a first IC package stacked over and electrically coupled to a second IC package, and wherein the thermal interface layer is between and thermally coupled to the first and second IC packages.

10. The apparatus of claim 7, wherein the at least one TEC apparatus that has a first sidewall that abuts a first edge of the thermal interface layer and a second sidewall that abuts a thermally conductive structure.

11. The apparatus of claim 10, wherein thermally conductive structure is an integrated heat spreader or an electromagnetic interference shield structure.

12. The apparatus of claim 7, wherein the at least one TEC apparatus comprises a first surface adjacent to the thermal interface layer and an opposing second surface adjacent to an integrated heat spreader or a heat sink.

13. The apparatus of claim 7, wherein the controller is to apply power the at least one TEC apparatus in response to a rise in temperature detected by the at least one temperature sensor.

14. The apparatus of claim 7, wherein the at least one temperature sensor is within the IC package, within the thermal interface layer, or at an interface between the IC package and the thermal interface layer.

15. The apparatus of claim 7, further comprising:
a power source coupled to the IC package.

16. An apparatus, comprising:
an integrated circuit (IC) package coupled to a substrate;
a thermal interface layer comprising a phase change material (PCM) over or adjacent to the IC package; and
at least one thermoelectric cooling (TEC) apparatus thermally coupled to the thermal interface layer, the at least one TEC apparatus having a first sidewall that abuts a first edge of the thermal interface layer and a second sidewall that abuts a thermally conductive structure.

17. The apparatus of claim 16, wherein the thermal interface layer has a first surface over and thermally coupled to the IC package and an opposing second surface over the first surface and thermally coupled to the thermally conductive structure or a second thermally conductive structure.

18. The apparatus of claim 16, wherein the IC package is a first IC package stacked over and electrically coupled to a second IC package, and wherein the thermal interface layer is between and thermally coupled to the first and second IC packages.

19. The apparatus of claim 16, wherein the at least one TEC apparatus is on a carrier substrate, wherein the carrier substrate comprises an aperture that surrounds the thermal interface layer.

20. The apparatus of claim 16, wherein a surface of the IC package is in direct contact with the thermally conductive structure or a second thermally conductive structures.

21. The apparatus of claim 16, further comprising:
a second TEC apparatus having a first sidewall that abuts a second edge of the thermal interface layer and a second sidewall that abuts the thermally conductive structure.

22. The apparatus of claim 16, wherein thermally conductive structure is an integrated heat spreader or an electromagnetic interference shield structure.

23. The apparatus of claim 16, further comprising:
a power source coupled to the IC package.

* * * * *